(12) United States Patent
Taneda et al.

(10) Patent No.: US 12,341,088 B2
(45) Date of Patent: Jun. 24, 2025

(54) WIRING BOARD AND SEMICONDUCTOR DEVICE EACH HAVING NON-PHOTOSENSITIVE THERMOSETTING ENCAPSULATING LAYER OVER PHOTOSENSITIVE RESIN LAYER OF INTERCONNECT STRUCTURE

(71) Applicant: SHINKO ELECTRIC INDUSTRIES CO., LTD., Nagano (JP)

(72) Inventors: Hiroshi Taneda, Nagano (JP); Noriyoshi Shimizu, Nagano (JP); Rie Mizutani, Nagano (JP); Masaya Takizawa, Nagano (JP); Yoshiki Akiyama, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 485 days.

(21) Appl. No.: 17/817,110

(22) Filed: Aug. 3, 2022

(65) Prior Publication Data

US 2023/0066839 A1 Mar. 2, 2023

(30) Foreign Application Priority Data

Aug. 30, 2021 (JP) ................................. 2021-139755

(51) Int. Cl.
*H01L 23/498* (2006.01)
*H01L 21/48* (2006.01)
(Continued)

(52) U.S. Cl.
CPC .... *H01L 23/49822* (2013.01); *H01L 21/4857* (2013.01); *H01L 23/49838* (2013.01);
(Continued)

(58) Field of Classification Search
CPC ......... H01L 23/49822; H01L 23/49838; H01L 24/13; H01L 24/16; H01L 24/32; H01L 24/73; H01L 25/0655
See application file for complete search history.

(56) References Cited

U.S. PATENT DOCUMENTS

2014/0102777 A1* 4/2014 Chen ................. H01L 23/49822
174/266
2015/0084206 A1* 3/2015 Lin ..................... H01L 23/5389
257/774
(Continued)

FOREIGN PATENT DOCUMENTS

JP 2017-157666 9/2017
JP 2017-220543 12/2017
(Continued)

OTHER PUBLICATIONS

Office Action mailed on Feb. 4, 2025 with respect to the corresponding Japanese patent application No. 2021-139755.

*Primary Examiner* — Michael Jung
(74) *Attorney, Agent, or Firm* — IPUSA, PLLC

(57) ABSTRACT

A wiring board includes an interconnect structure including a plurality of interconnect layers, and a plurality of insulating layers having a photosensitive resin as a main component thereof, and an encapsulating resin layer having a non-photosensitive thermosetting resin as a main component thereof, laminated on an uppermost insulating layer of the plurality of insulating layers. An uppermost interconnect layer of the plurality of interconnect layers includes a pad protruding from the uppermost insulating layer. The encapsulating resin layer exposes an upper surface of the pad, and covers at least a portion of a side surface of the pad, and at least a portion of side surfaces of the plurality of insulating layers. The pad is configured to receive a semiconductor chip to be mounted thereon.

9 Claims, 14 Drawing Sheets

(51) Int. Cl.
*H01L 23/00* (2006.01)
*H01L 25/065* (2023.01)

(52) U.S. Cl.
CPC .............. *H01L 24/13* (2013.01); *H01L 24/16* (2013.01); *H01L 24/32* (2013.01); *H01L 24/73* (2013.01); *H01L 25/0655* (2013.01); *H01L 2224/13111* (2013.01); *H01L 2224/13113* (2013.01); *H01L 2224/16227* (2013.01); *H01L 2224/32227* (2013.01); *H01L 2224/73204* (2013.01); *H01L 2924/014* (2013.01)

(56) References Cited

U.S. PATENT DOCUMENTS

| | | |
|---|---|---|
| 2017/0256482 A1 | 9/2017 | Furuichi et al. |
| 2017/0352628 A1 | 12/2017 | Furuichi et al. |
| 2018/0053732 A1* | 2/2018 | Baek ................... H01L 23/5389 |
| 2018/0174994 A1* | 6/2018 | Choi ....................... H01L 23/13 |
| 2019/0333847 A1 | 10/2019 | Watanabe et al. |
| 2020/0092993 A1 | 3/2020 | Taneda et al. |

FOREIGN PATENT DOCUMENTS

| | | |
|---|---|---|
| JP | 2019-192886 | 10/2019 |
| JP | 2020-047735 | 3/2020 |

* cited by examiner

WIRING BOARD AND SEMICONDUCTOR DEVICE EACH HAVING NON-PHOTOSENSITIVE THERMOSETTING ENCAPSULATING LAYER OVER PHOTOSENSITIVE RESIN LAYER OF INTERCONNECT STRUCTURE

CROSS-REFERENCE TO RELATED APPLICATIONS

This application is based upon and claims priority to Japanese Patent Application No. 2021-139755, filed on Aug. 30, 2021, the entire contents of which are incorporated herein by reference.

FIELD

Certain aspects of the embodiments discussed herein are related to wiring boards, semiconductor devices, and methods for manufacturing wiring boards.

BACKGROUND

Conventionally, wiring boards to be mounted with electronic components, such as semiconductor chips or the like, include wiring boards having a plurality of interconnect layers and a plurality of insulating layers that are alternately laminated by a build-up process in order to increase the density of interconnect patterns. An example of this type of wiring board is proposed in Japanese Laid-Open Patent Publication No. 2017-157666, for example. The proposed wiring board has a low-density interconnect layer including an insulating layer made of a thermosetting resin, and a high-density interconnect layer including an insulating layer made of a photosensitive resin and laminated on the low-density interconnect layer.

Other examples of the wiring board are proposed in Japanese Laid-Open Patent Publication No. 2020-047735, and Japanese Laid-Open Patent Publication No. 2019-192886, for example.

However, a warp may be generated in the wiring board described above, due to a difference between thermal expansion coefficients of the insulating layer made of the thermosetting resin and the insulating layer made of the photosensitive resin.

SUMMARY

Accordingly, it is an object in one aspect of the embodiments to provide a wiring board, a semiconductor device, and a method for manufacturing the wiring board, capable of reducing the warp.

According to one aspect of the embodiments, a wiring board includes a first interconnect structure including a plurality of first interconnect layers, and a plurality of insulating layers having a photosensitive resin as a main component thereof; and an encapsulating resin layer having a non-photosensitive thermosetting resin as a main component thereof, laminated on an uppermost first insulating layer of the plurality of first insulating layers, wherein an uppermost first interconnect layer of the plurality of first interconnect layers includes a pad protruding from the uppermost first insulating layer, the encapsulating resin layer exposes an upper surface of the pad, and covers at least a portion of a side surface of the pad, and at least a portion of side surfaces of the plurality of first insulating layers, and the pad is configured to receive a semiconductor chip to be mounted thereon.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
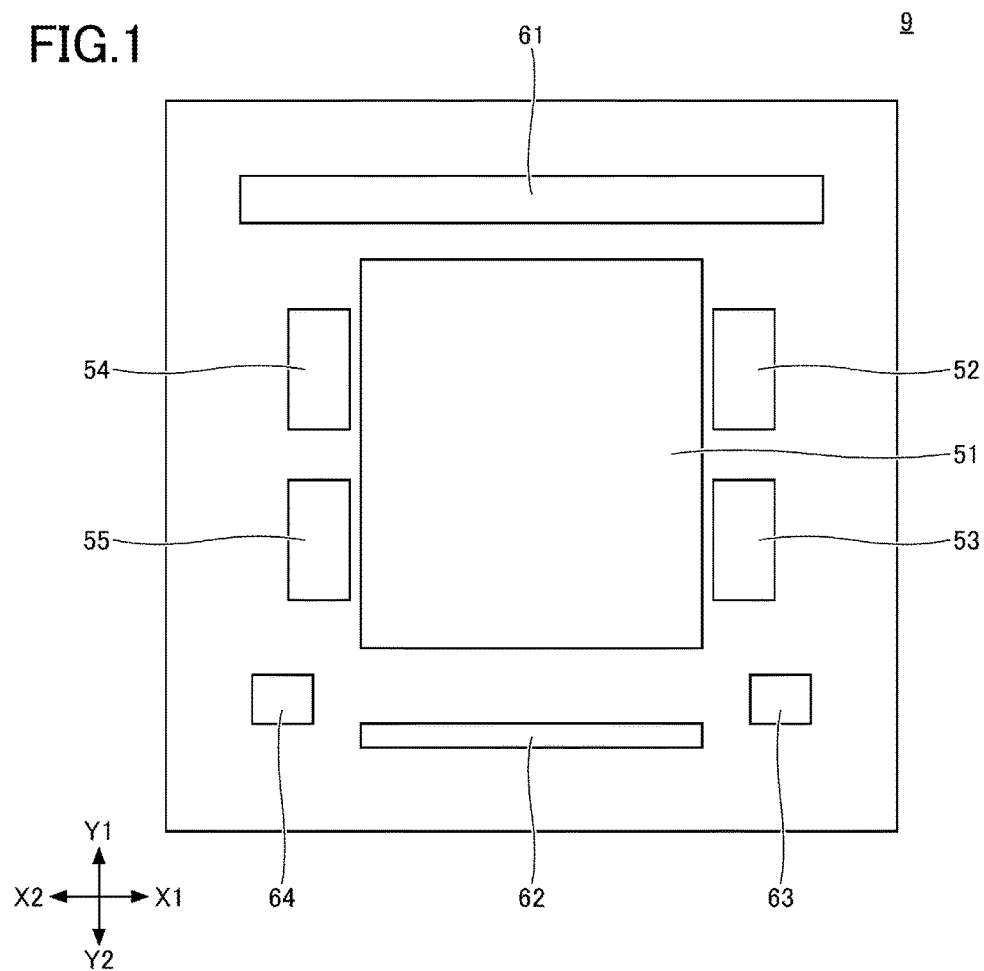
FIG. 1 is a diagram illustrating a layout of a wiring board according to a reference example.

Preferred embodiments of the present invention will be described with reference to the accompanying drawings. In the drawings, those parts that are the same or have substantially the same functions are designated by the same reference numerals, and a repeated description of the same parts or the parts having substantially the same functions may be omitted.

In the present disclosure, an X1-X2 direction, a Y1-Y2 direction, and a Z1-Z2 direction are perpendicular to one another. A plane including the X1-X2 direction and the Y1-Y2 direction is referred to as an XY-plane, a plane including the Y1-Y2 direction and the Z1-Z2 direction is referred to as a YZ-plane, and a plane including the Z1-Z2 direction and the X1-X2 direction is referred to as a ZX-plane. For the sake of convenience, the Z1-Z2 direction may be an up-down (vertical) direction, and the Z1-side may be an upper side, and the Z2-side may be a lower side. In addition, a plan view refers to a view of an object viewed from the Z1-side, and a planar shape refers to a shape of the object in the plan view viewed from the Z1-side. However, the wiring board and the semiconductor device may be used in an up-side-down state, or may be used in a inclined state inclined at an arbitrary angle from a horizontal state, for example.

A description will now be given of a wiring board, a semiconductor device, and a method for manufacturing the wiring board according to each embodiment of the present invention.

Reference Example

Figure 2:
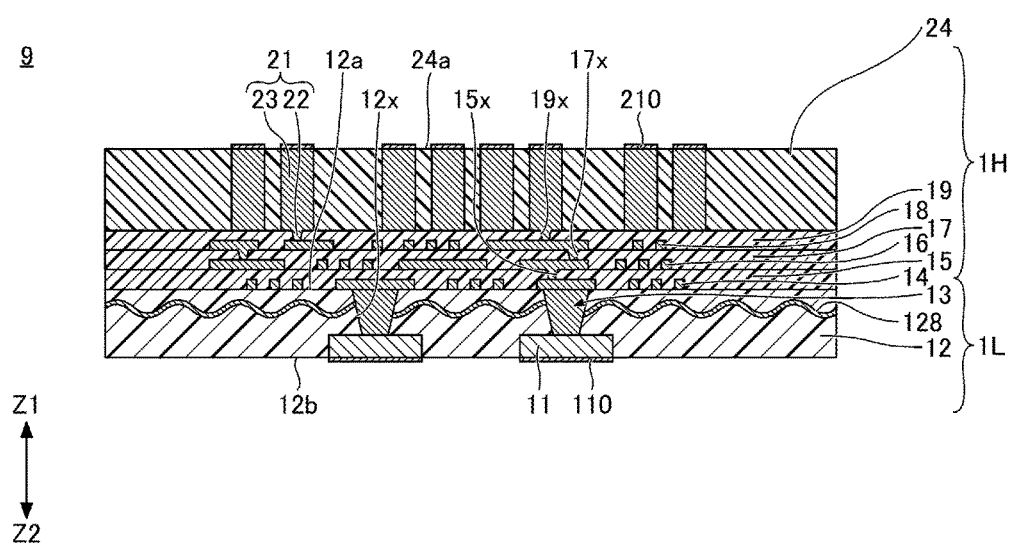
FIG. 2 is a cross sectional view illustrating the wiring board according to the reference example.

First, a reference example will be described. FIG. 1 is a diagram illustrating a layout of a wiring board according to a reference example. FIG. 2 is a cross sectional view illustrating the wiring board according to the reference example.

As illustrated in FIG. 1 and FIG. 2, a wiring board 9 according to the reference example includes a second interconnect structure 1L, a first interconnect structure 1H laminated on the second interconnect structure 1L, and an encapsulating resin layer 24 laminated on the first interconnect structure 1H. A planar shape of the wiring board 9 may be a square shape, a rectangular shape, or the like, for example.

The wiring board 9 has a first semiconductor chip mounting area 51, a second semiconductor chip mounting area 52, a third semiconductor chip mounting area 53, a fourth semiconductor chip mounting area 54, and a fifth semiconductor chip mounting area 55. The first semiconductor chip mounting area 51, the second semiconductor chip mounting area 52, the third semiconductor chip mounting area 53, the fourth semiconductor chip mounting area 54, and the fifth semiconductor chip mounting area 55 have a planar shape that is a rectangular shape. In the plan view, the first semiconductor chip mounting area 51 is larger than the second semiconductor chip mounting area 52, the third semiconductor chip mounting area 53, the fourth semiconductor chip mounting area 54, and the fifth semiconductor chip mounting area 55. In the plan view, the second semiconductor chip mounting area 52, the third semiconductor chip mounting area 53, the fourth semiconductor chip mounting area 54, and the fifth semiconductor chip mounting area 55 have dimensions that are common and same among one another.

In the plan view, the first semiconductor chip mounting area 51 is arranged at a center of the wiring board 9. In the plan view, the second semiconductor chip mounting area 52 and the third semiconductor chip mounting area 53 are disposed on the X1-side of the first semiconductor chip mounting area 51, and the fourth semiconductor chip mounting area 54 and the fifth semiconductor chip mounting area 55 are disposed on the X2-side of the first semiconductor chip mounting area 51. In the plan view, the third semiconductor chip mounting area 53 is disposed on the Y2-side of the second semiconductor chip mounting area 52, and the fifth semiconductor chip mounting area 55 is disposed on the Y2-side of the fourth semiconductor chip mounting area 54.

One semiconductor chip is mounted in each of the first semiconductor chip mounting area 51, the second semiconductor chip mounting area 52, the third semiconductor chip mounting area 53, the fourth semiconductor chip mounting area 54, and the fifth semiconductor chip mounting area 55.

The wiring board 9 includes a first capacitor mounting area 61, a second capacitor mounting area 62, a third capacitor mounting area 63, and a fourth capacitor mounting area 64. The first capacitor mounting area 61, the second capacitor mounting area 62, the third capacitor mounting area 63, and the fourth capacitor mounting area 64 have a planar shape that is a rectangular shape.

In the plan view, the first capacitor mounting area 61 is disposed on the Y1-side of the first semiconductor chip mounting area 51, the second semiconductor chip mounting area 52, and the fourth semiconductor chip mounting area 54. In the X1-X2 direction, a length of the first capacitor mounting area 61 is greater than a sum of lengths of the first semiconductor chip mounting area 51, the second semiconductor chip mounting area 52, and the fourth semiconductor chip mounting area 54. A plurality of capacitors is mounted in the first capacitor mounting area 61.

In the plan view, the second capacitor mounting area 62 is disposed on the Y2-side of the second semiconductor chip mounting area 52. In the X1-X2 direction, a length of the second capacitor mounting area 62 is approximately equal to a length of the first semiconductor chip mounting area 51. A plurality of capacitors is mounted in the second capacitor mounting area 62.

In the plan view, the third capacitor mounting area 63 is disposed on the X1-side of the second capacitor mounting area 62, and on the Y2-side of the third semiconductor chip mounting area 53. In the plan view, the fourth capacitor mounting area 64 is disposed on the X2-side of the second capacitor mounting area 62, and on the Y2-side of the fifth semiconductor chip mounting area 55. Two capacitors are mounted in each of the third capacitor mounting area 63 and the fourth capacitor mounting area 64.

The second interconnect structure 1L includes low-density interconnect layers having an interconnect density lower than an interconnect density of each of high-density interconnect layers of the first interconnect structure 1H. The second interconnect structure 1L includes an interconnect layer 11, an insulating layer 12, and an interconnect layer 13. In contrast, the first interconnect structure 1H includes the high-density interconnect layers having the interconnect density higher than the interconnect density of each of the low-density interconnect layers of the second interconnect structure 1L. The first interconnect structure 1H includes an interconnect layer 14, an insulating layer 15, an interconnect layer 16, an insulating layer 17, an interconnect layer 18, an insulating layer 19, and an interconnect layer 21.

The interconnect layer 11 is the lowermost interconnect layer exposed at a lower surface of the insulating layer 12, and an upper surface and a side surface of the interconnect layer 11 are covered with the insulating layer 12. The lower surface of the interconnect layer 11 may coincide with a lower surface 12b of the insulating layer 12, for example. The lower surface of the interconnect layer 11 may be exposed from the lower surface 12b of the insulating layer 12 at a recessed position that is recessed toward the interconnect layer 13, and a portion of the side surface and the lower surface of the interconnect layer 11 may project downward from the lower surface 12b of the insulating layer 12.

The interconnect layer 11 is a conductive pad having a planar shape that is a circular shape, for example, but the interconnect layer 11 may include an interconnect pattern. A surface treated layer 110 may be formed on the lower surface of the interconnect layer 11.

The insulating layer 12 covers the upper surface and the side surface of the interconnect layer 11. The insulating layer 12 has a non-photosensitive thermosetting resin as a main component thereof, and includes a reinforcing member 128. An upper surface 12a of the insulating layer 12 is a smooth surface (low-roughness surface) with little irregularities. For example, the upper surface 12a of the insulating layer 12 is a polished surface. The upper surface 12a of the insulating layer 12 has a surface roughness smaller than a surface roughness of an inner wall defining a via hole 12x.

The interconnect layer 13 is a via interconnect embedded in the insulating layer 12. More particularly, the interconnect layer 13 is a via interconnect filling the via hole 12x that penetrates the insulating layer 12 and exposes the upper surface of the interconnect layer 11. The interconnect layer 13 is electrically connected to the interconnect layer 11.

An upper surface of the interconnect layer 13, that is the via interconnect, is exposed from the upper surface 12a of the insulating layer 12. The upper surface of the interconnect layer 13 may coincide with the upper surface 12a of the insulating layer 12, for example. The upper surface of the interconnect layer 13 is directly bonded to a lower surface of the interconnect layer 14. A lower surface of the interconnect layer 13 is directly bonded to the interconnect layer 11 inside the insulating layer 12. Similarly to the upper surface 12a of the insulating layer 12, a top end surface of the interconnect layer 13 may be a smooth surface (low-roughness surface) with little irregularities. For example, the top end surface of the interconnect layer 13 is a polished surface.

The interconnect layer 14 is formed on the upper surface 12a of the insulating layer 12. The interconnect layer 14 is formed directly on the upper surface 12a of the insulating layer 12, and includes an interconnect (interconnect pattern or pad) that is electrically connected to the interconnect layer 11 through the interconnect layer 13. That is, a portion of the lower surface of the interconnect layer 14 is in contact with the upper surface of the interconnect layer 13, and the interconnect layer 14 and the interconnect layer 13 are electrically connected to each other.

The insulating layer 15 has a photosensitive resin as a main component thereof. The insulating layer 15 is formed on the upper surface 12a of the insulating layer 12, so as to cover the interconnect layer 14.

The interconnect layer 16 is formed on one side (Z1-side) of the insulating layer 15, and is electrically connected to the interconnect layer 14. The interconnect layer 16 includes a via interconnect filling a via hole 15x that penetrates the insulating layer 15 and exposes an upper surface of interconnect layer 14, and an interconnect pattern formed on an upper surface of insulating layer 15.

The insulating layer 17 has a photosensitive resin as a main component thereof. The insulating layer 17 is formed on one side (Z1-side) of the insulating layer 15, so as to cover the interconnect layer 16.

The interconnect layer 18 is formed on one side (Z1-side) of the insulating layer 17, and is electrically connected to the interconnect layer 16. The interconnect layer 18 includes a via interconnect filling a via hole 17x that penetrates the insulating layer 17 and exposes an upper surface of the interconnect layer 16, and an interconnect pattern formed on an upper surface of the insulating layer 17.

The insulating layer 19 has a photosensitive resin as a main component thereof. The insulating layer 19 is formed on one side (Z1-side) of the insulating layer 17, so as to cover the interconnect layer 18. In the first interconnect structure 1H, the insulating layer 19 is the uppermost insulating layer.

The interconnect layer 21 is formed on one side (Z1-side) of the insulating layer 19. In the first interconnect structure 1H, the interconnect layer 21 is the uppermost interconnect layer. The interconnect layer 21 includes a via interconnect 22 filling a via hole 19x that penetrates the insulating layer 19 and exposes an upper surface of the interconnect layer 18, and a conductive pad 23 protruding from an upper surface of the insulating layer 19. A surface treated layer 210, similar to the surface treated layer 110, may be formed on an upper surface of the pad 23.

The pad 23 is provided in the first semiconductor chip mounting area 51, the second semiconductor chip mounting area 52, the third semiconductor chip mounting area 53, the fourth semiconductor chip mounting area 54, the fifth semiconductor chip mounting area 55, the first capacitor mounting area 61, the second capacitor mounting area 62, the third capacitor mounting area 63, and the fourth capacitor mounting area 64.

The encapsulating resin layer 24 is laminated on the insulating layer 19 that is the uppermost insulating layer of the first interconnect structure 1H. The encapsulating resin layer 24 exposes the upper surface of the pad 23, and covers at least a portion of a side surface of the pad 23.

For example, a mold resin may be used as a material forming the encapsulating resin layer 24. The mold resin is an insulating resin having a non-photosensitive thermosetting resin as a main component thereof, and can be used by transfer molding, compression molding, injection molding, or the like, for example. For example, a thermal expansion coefficient of the encapsulating resin layer 24 is 20 ppm/K or lower, and a Young's modulus of the encapsulating resin layer 24 is 1 GPa or higher.

According to the reference example having the configuration described above, it is possible to reduce a warp compared to a case where the encapsulating resin layer 24 is not provided. Further, the thicker the encapsulating resin layer 24 becomes, the greater the effect of reducing the warp becomes.

However, when forming the pad 23 by the semi-additive process and the encapsulating resin layer 24 is made thick, it is difficult to form the pad 23 with a high accuracy unless a diameter of the pad 23 is increased. This is because the larger an aspect ratio of the pad 23 becomes, the lower the exposure accuracy becomes. For example, it is difficult to form the pad 23 with an aspect ratio of 8 or larger with a high accuracy using the semi-additive process. Accordingly, even in the reference example, there are cases where it is difficult to sufficiently reduce the warp.

Accordingly, the present inventors made diligent studies on a configuration that can further reduce the warp without having to make thick the portion of the encapsulating resin layer 24 where the pad 23 is formed. As a result, the present inventors found that a volume of the encapsulating resin layer 24 included in the wiring board can be increased to further reduce the warp, by providing the encapsulating resin layer 24 so as to make contact with at least a portion of a side surface of a laminated structure of the insulating layers 15, 17, and 19. Based on these findings, the present inventors conceived the following embodiments.

First Embodiment

Next, a first embodiment will be described. The first embodiment relates to a wiring board.

[Structure of Wiring Board According to First Embodiment]

Figure 3:
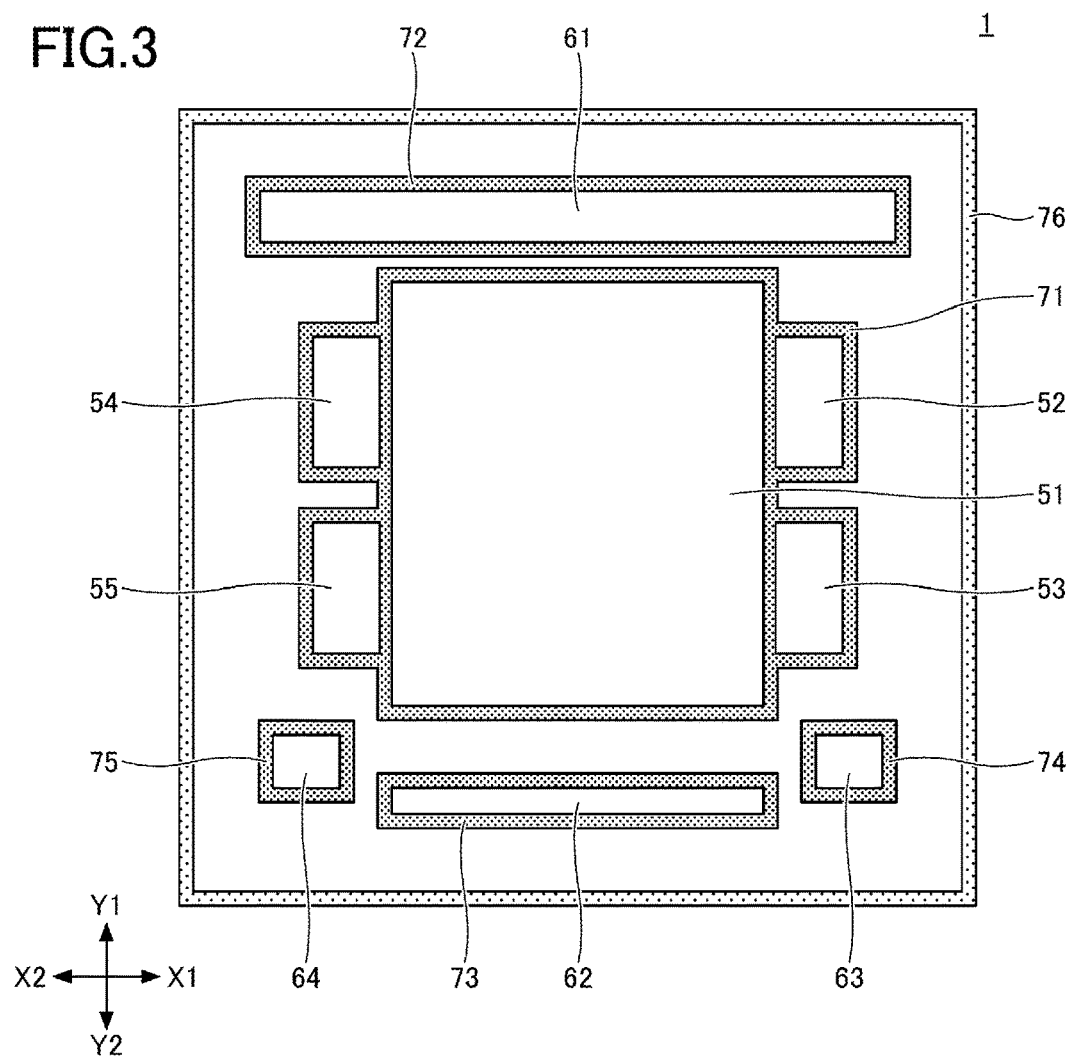
FIG. 3 is a diagram illustrating a layout of a wiring board according to a first embodiment.
Figure 4:
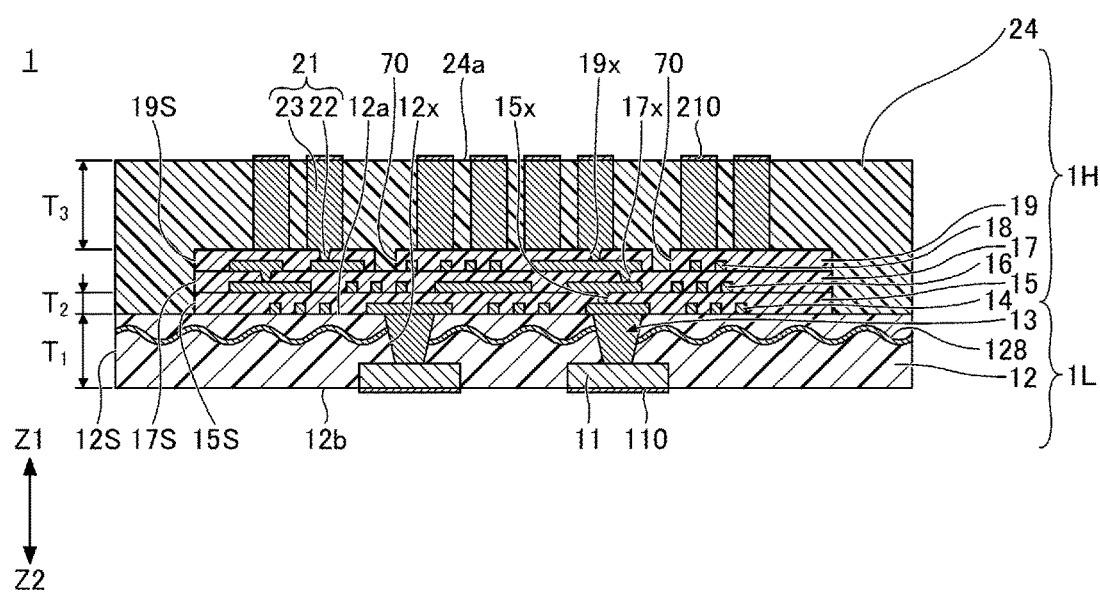
FIG. 4 is a cross sectional view illustrating the wiring board according to the first embodiment.

FIG. 3 is a diagram illustrating a layout of the wiring board according to the first embodiment. FIG. 4 is a cross sectional view illustrating the wiring board according to the first embodiment. As illustrated in FIG. 3 and FIG. 4, a wiring board 1 according to the first embodiment includes the second interconnect structure 1L, the first interconnect structure 1H laminated on the second interconnect structure 1L, and the encapsulating resin layer 24 laminated on the first interconnect structure 1H, similar to the wiring board 9 according to the reference example. A planar shape of the wiring board 1 may be a square shape, a rectangular shape, or the like, for example. However, the planar shape of the wiring board 1 is not particularly limited, and the wiring board 1 may have an arbitrary planar shape.

Similar to the wiring board 9, the wiring board 1 has the first semiconductor chip mounting area 51, the second semiconductor chip mounting area 52, the third semiconductor chip mounting area 53, the fourth semiconductor chip mounting area 54, and the fifth semiconductor chip mounting area 55. Similar to the wiring board 9, the wiring board 1 also has the first capacitor mounting area 61, the second capacitor mounting area 62, the third capacitor mounting area 63, and the fourth capacitor mounting area 64.

The second interconnect structure 1L includes the low-density interconnect layers having the interconnect density lower than the interconnect density of each of the high-density interconnect layers of the first interconnect structure 1H. The second interconnect structure 1L includes the interconnect layer 11, the insulating layer 12, and the interconnect layer 13. In contrast, the first interconnect structure 1H includes the high-density interconnect layers having the interconnect density higher than the interconnect density of the second interconnect structure 1L. The first interconnect structure 1H includes the interconnect layer 14, the insulating layer 15, the interconnect layer 16, the insulating layer 17, the interconnect layer 18, the insulating layer 19, and the interconnect layer 21.

The interconnect layer 11 is the lowermost interconnect layer that is exposed at the lower surface of the insulating layer 12, and the upper surface and the side surface of the interconnect layer are covered with the insulating layer 12. The lower surface of the interconnect layer 11 may coincide with the lower surface 12b of the insulating layer 12, for example. The lower surface of the interconnect layer 11 may be exposed from the lower surface 12b of the insulating layer 12 at a recessed position that is recessed toward the interconnect layer 13, and a portion of the side surface and the lower surface of the interconnect layer 11 may project downward from the lower surface 12b of the insulating layer 12.

The interconnect layer 11 is a pad having a planar shape that is a circular shape with a diameter of approximately 150 μm, for example, but the interconnect layer 11 may include an interconnect pattern. A space between two mutually adjacent interconnect layers 11 may be approximately 200 μm, for example. A material used for the interconnect layer 11 may be copper (Cu) or the like, for example. The interconnect layer 11 may have a thickness in a range of approximately 10 μm to approximately 20 μm, for example. The interconnect layer 11 may be used as an external connection terminal (pad) for electrically connecting to another wiring board. The interconnect layer 11 may be used as an external connection terminal (pad) for electrically connecting to a chip capacitor or the like.

The surface treated layer 110 may be formed on the lower surface of the interconnect layer 11. Examples of the surface treated layer 110 include an Au layer, a Ni/Au layer (a metal layer having a Ni layer and a Au layer that are laminated in this order), a Ni/Pd/Au layer (a metal layer having a Ni layer, a Pd layer, and a Au layer that are laminated in this order), or the like, for example. The lower surface of the interconnect layer 11 may be subjected to an antioxidation treatment, such as an organic solderability preservative (OSP) treatment or the like, for example.

The insulating layer 12 covers the upper surface and the side surface of the interconnect layer 11. The insulating layer 12 has a non-photosensitive thermosetting resin as a main component thereof, and includes the reinforcing member 128. The insulating layer 12 may be configured to include the reinforcing member 128 impregnated with a non-photosensitive thermosetting resin. Hereinafter, a layer "having a non-photosensitive thermosetting resin as a main component thereof" is intended to mean that components other than the non-photosensitive thermosetting resin, such as fillers or the like, may be included in the layer in addition to the non-photosensitive thermosetting resin.

Examples of the non-photosensitive thermosetting resin used for the insulating layer 12 include epoxy resins, imide resins, phenolic resins, cyanate-based resins, or the like, for example. Examples of the reinforcing member 128 include woven and non-woven fabrics or the like of glass fibers, carbon fibers, aramid fibers, or the like, for example. Examples of the filler included in the insulating layer 12 include silica ($SiO_2$), kaolin ($Al_2Si_2O_5(OH)_4$), talc ($Mg_3Si_4O_{10}(OH)_2$), alumina ($Al_2O_3$), or the like, for example. The insulating layer 12 may include a mixture of such fillers. Examples of the reinforcing member 128 may include a glass cloth using glass fiber bundles, and cloths using carbon fiber bundles, polyester fiber bundles, nylon (polyamide) fiber bundles, aramid fiber bundles, or the like, for example.

A thickness $T_1$ of the insulating layer 12 may be in a range of approximately 60 μm to approximately 70 μm, for example. The thermal expansion coefficient of the insulating layer 12 may be in a range higher than or equal to 5 ppm/K and lower than or equal to 10 ppm/K, for example. The thermal expansion coefficient of the insulating layer 12 can be adjusted to a predetermined value by a filler content, a composition of the insulating resin, or the like, for example. The thermal expansion coefficient of the insulating layer 12 is lower than the thermal expansion coefficient of each of the insulating layers 15, 17, and 19.

The reinforcing member 128 is unevenly distributed inside the insulating layer 12 on the side closer to the first interconnect structure 1H (that is, on the upper side) than a center along a thickness direction of the insulating layer 12. More particularly, the reinforcing member 128 is arranged at a position offset more toward the first interconnect structure 1H than the center along the thickness direction of the insulating layer 12. Hence, in the insulating layer 12, a thickness of the resin layer from the upper surface 12a of the insulating layer 12 to the reinforcing member 128, is set smaller than a thickness of the resin layer from the reinforcing member 128 to the lower surface 12b of the insulating layer 12.

The upper surface 12a of the insulating layer 12 is a smooth surface (low-roughness surface) with little irregularities. For example, the upper surface 12a of the insulating layer 12 is a polished surface. The upper surface 12a of the insulating layer 12 has a surface roughness smaller than a surface roughness of the inner wall defining the via hole 12x. The roughness of the upper surface 12a of the insulating layer 12, represented by a value of a surface roughness Ra, may be set in a range of approximately 15 µm to approximately 40 nm, for example. Further, the roughness of the inner wall defining the via hole 12x, represented by a value of the surface roughness Ra, may be set in a range of approximately 300 nm to approximately 400 nm, for example. The value of the surface roughness Ra is one kind of numerical value representing the surface roughness, and is also referred to as an arithmetic mean roughness. More particularly, absolute values of a height that varies within a measurement area are measured from a surface forming an average line, and an arithmetic mean (arithmetic average) of the absolute values is obtained as the value of the surface roughness Ra.

The interconnect layer 13 is a via interconnect embedded in the insulating layer 12. More particularly, the interconnect layer 13 is the via interconnect filling the via hole 12x that penetrates the insulating layer 12 and exposes the upper surface of the interconnect layer 11. The interconnect layer 13 is electrically connected to the interconnect layer 11. The via hole 12x may be a cavity having an inverted truncated cone shape, and a diameter of an opening of the cavity at one end which opens to the insulating layer 15 is greater than a diameter of the opening at the other end at a bottom surface of the cavity formed by the upper surface of the interconnect layer 11. A diameter of the opening of the cavity of the via hole 12x, that opens at the one end to the insulating layer 15, may be in a range of approximately 60 µm to approximately 70 µm, for example.

The upper surface of the interconnect layer 13, that is the via interconnect, is exposed from the upper surface 12a of the insulating layer 12. The upper surface of the interconnect layer 13 may be coincide with the upper surface 12a of the insulating layer 12, for example. The upper surface of the interconnect layer 13 is directly bonded to the lower surface of the interconnect layer 14. The lower surface of the interconnect layer 13 is directly bonded to the interconnect layer 11 inside the insulating layer 12. A material used for the interconnect layer 13 may be similar to the material used for the interconnect layer 11, for example.

Similar to the upper surface 12a of the insulating layer 12, the top end surface of the interconnect layer 13 is a smooth surface (low-roughness surface) with little irregularities. For example, the top end surface of the interconnect layer 13 is a polished surface. The roughness of the top end surface of the interconnect layer 13, represented by the value of the surface roughness Ra, may be set in a range of approximately 15 nm to approximately 40 nm, for example.

In the first embodiment, the interconnect layer 13 is formed solely of the via interconnect formed inside the via hole 12x of the insulating layer 12. In other words, the interconnect layer 13 does not include an interconnect pattern formed integrally on the upper surface 12a of the insulating layer 12. The interconnect layer 13 and the interconnect layer 14 are electrically connected to each other, but the interconnect layer 13 and the interconnect layer 14 are not formed integrally. More particularly, in the manufacturing method that will be described later, when forming the interconnect layer 14 by the semi-additive process, a seed layer is interposed between the upper surface of the interconnect layer 13 and the lower surface of the interconnect layer 14. This configuration using the seed layer is employed, in order to form a high-density interconnect pattern (having a line/space of approximately 3 µm/3 µm, for example) as the interconnect layer 14, as will be described later. Details of this configuration using the seed layer will be described later in conjunction with the method for manufacturing the wiring board 1.

The interconnect layer 14 is formed on the upper surface 12a of the insulating layer 12. The interconnect layer 14 is formed directly on the upper surface 12a of the insulating layer 12, and includes an interconnect (interconnect pattern or pad) electrically connected to the interconnect layer 11 through the interconnect layer 13. That is, a portion of the lower surface of the interconnect layer 14 is in contact with the upper surface of the interconnect layer 13, and the interconnect layer 14 and the interconnect layer 13 are electrically connected to each other. A material used for the interconnect layer 14 may be copper (Cu) or the like, for example. The interconnect layer 14 may be a laminated film formed by multiple conductor layers that are laminated.

The interconnect layer 14 has an interconnect density higher than (a line/space narrower than) that of the interconnect layer 11, and is thinner than the interconnect layer 11. In this specification, an interconnect layer having a line/space less than or equal to 8 µm/8 µm is defined as an interconnect layer having a high interconnect density. The line/space of the interconnect layer 14 may be in a range of approximately 1 µm/1 µm to approximately 3 µm/3 µm, for example. A thickness of the interconnect layer 14 may be in a range of approximately 1 µm to approximately 3 µm, for example.

The line of the line/space represents a line width (interconnect or wiring width), and the space of the line/space represents a space width (interconnect or wiring interval) between mutually adjacent lines (interconnects). For example, the line/space represented by 2 µm/2 µm refers to a case where the line width is 2 µm and the space width between mutually adjacent lines is 2 µm.

The insulating layer 15 is an insulating layer having a photosensitive resin as a main component thereof. The insulating layer "having a photosensitive resin as a main component thereof" is intended to mean that components other than the photosensitive resin, such as fillers or the like, may be included in the layer in addition to the photosensitive resin. The insulating layer 15 may include a filler, such as silica ($SiO_2$) or the like, for example.

The insulating layer 15 is formed on the upper surface 12a of the insulating layer 12, so as to cover the interconnect layer 14. Examples of the photosensitive resin used for the insulating layer 15 include insulating resins, such as phenolic resins, polyimide resins, or the like, for example. A thickness $T_2$ of the insulating layer 15 may be in a range greater than or equal to 5 µm and less than or equal to 10 µm, for example. A thermal expansion coefficient of the insulating layer 15 may be in a range higher than or equal to 40 ppm/K and lower than or equal to 60 ppm/K, for example. The thermal expansion coefficient of the insulating layer 15 can be adjusted to a predetermined value by a filler content, a composition of the insulating resin, or the like, for example.

In the plan view, the insulating layer 15 is formed to be narrower than the insulating layer 12, and an outer peripheral portion of the upper surface of the insulating layer 12 is not covered by the insulating layer 15. That is, the outer peripheral portion of the upper surface of the insulating layer 12 is exposed from the insulating layer 15.

The interconnect layer 16 is formed on one side (Z1-side) of the insulating layer 15, and is electrically connected to the interconnect layer 14. The interconnect layer 16 includes the via interconnect filling the via hole 15x penetrating the insulating layer 15 to expose the upper surface of interconnect layer 14, and the interconnect pattern formed on the upper surface of insulating layer 15. The via hole 15x may be a cavity having an inverted truncated cone shape, and a diameter of an opening of the cavity at one end which opens to the insulating layer 17 is greater than a diameter of the opening at the other end at a bottom surface of the cavity formed by the upper surface of the interconnect layer 14. A diameter of the opening of the cavity of the via hole 15x, that opens at the one end to the insulating layer 17, may be in a range of approximately 10 μm to approximately 20 μm, for example. A material used for the interconnect layer 16, and a thickness of the interconnect pattern forming the interconnect layer 16, may be similar to those of the interconnect layer 14, for example.

The line/space of the interconnect layer 16 may be in a range of approximately 1 μm/1 μm to approximately 3 μm/3 μm, for example, but the line/space of the interconnect layer 16 may be even narrower than the line/space of the interconnect layer 14. That is, the upper surface 12a of the insulating layer 12 is a polished surface, and is smoother than the lower surface 12b of the insulating layer 12. The upper surface of the insulating layer 15 having the photosensitive resin as the main component thereof is even smoother than the upper surface 12a of the insulating layer 12 having the non-photosensitive thermosetting resin as the main component thereof. For this reason, the line/space of the interconnect layer 16 can be made narrower than the line/space of the interconnect layer 14. For example, the line/space of the interconnect layer 14 can be 3 μm/3 μm, and the line/space of the interconnect layer 16 can be 1 μm/1 μm. The same applies to the interconnect layer 18 described below.

The insulating layer 17 is formed on one side (Z1-side) of the insulating layer 15, so as to cover the interconnect layer 16. In the plan view, the insulating layer 17 is formed to be narrower than the insulating layer 12, and an outer peripheral portion of the upper surface of the insulating layer 12 is exposed from the insulating layer 17. In the plan view, an edge of the insulating layer 17 overlaps an edge of the insulating layer 15. The material, thickness and thermal expansion coefficient of the insulating layer 17 may be similar to those of the insulating layer 15, for example. The insulating layer 17 may include a filler, such as silica ($SiO_2$) or the like, for example.

The interconnect layer 18 is formed on one side (Z1-side) of the insulating layer 17, and is electrically connected to the interconnect layer 16. The interconnect layer 18 includes the via interconnect filling the via hole 17x penetrating the insulating layer 17 to expose the upper surface of the interconnect layer 16, and the interconnect pattern formed on the upper surface of the insulating layer 17. The via hole 17x may be a cavity having an inverted truncated cone shape, and a diameter of an opening of the cavity at one end which opens to the insulating layer 19 is greater than a diameter of the opening at the other end at a bottom surface of the cavity formed by the upper surface of the interconnect layer 16. A diameter of the opening of the cavity of the via hole 17x, that opens at the one end to the insulating layer 19, may be in a range of approximately 10 μm to approximately 20 μm, for example. A material used for the interconnect layer 18, and a thickness of the interconnect pattern forming the interconnect layer 18, may be similar to those of the interconnect layer 14, for example. The line/space of the interconnect pattern forming the interconnect layer 18 may be similar to the line/space of the interconnect layer 16, for example.

The insulating layer 19 is formed on one side (Z1-side) of the insulating layer 17, so as to cover the interconnect layer 18. In the plan view, the insulating layer 19 is formed to be narrower than the insulating layer 12, and a outer peripheral portion of the upper surface of the insulating layer 12 is exposed from the insulating layer 19. In the plan view, an edge of the insulating layer 19 overlaps the edges of the insulating layers 15 and 17. In the first interconnect structure 1H, the insulating layer 19 is the uppermost insulating layer. The material, thickness and thermal expansion coefficient of the insulating layer 19 may be similar to those of the insulating layer 15, for example. The insulating layer 19 may include a filler, such as silica ($SiO_2$) or the like, for example.

The interconnect layer 21 is formed on one side (Z1-side) of the insulating layer 19. In the first interconnect structure 1H, the interconnect layer 21 is the uppermost interconnect layer. The interconnect layer 21 includes the via interconnect 22 filling the via hole 19x penetrating the insulating layer 19 to expose the upper surface of the interconnect layer 18, and the pad 23 protruding from the upper surface of the insulating layer 19. The via hole 19x may be a cavity having an inverted truncated cone shape, and a diameter of an opening of the cavity at one end which opens to the pad 23 is greater than a diameter of the opening at the other end at a bottom surface of the cavity formed by the upper surface of the interconnect layer 18. A diameter of the opening of the cavity of the via hole 19x, that opens at the one end to the pad 23, may be in a range of approximately 10 μm to approximately 20 μm, for example.

A material used for the interconnect layer 21 may be similar to the material used for the interconnect layer 14, for example. A thickness of pad 23, from the upper surface of insulating layer 19 to the upper surface of pad 23, may be in a range of 80 μm to 150 μm, for example. A planar shape of the pad 23 may be a circular shape with a diameter in a range of approximately 20 μm to approximately 30 μm, for example. A pitch of the pad 23 may be in a range of approximately 40 μm to approximately 50 μm, for example. A portion of the pad 23 exposed from the encapsulating resin layer 24 is used as an external connection terminal for electrically connecting to the semiconductor chip. That is, the semiconductor chip, the capacitor, or the like can be mounted on the pad 23.

The pad 23 is provided in the first semiconductor chip mounting area 51, the second semiconductor chip mounting area 52, the third semiconductor chip mounting area 53, the fourth semiconductor chip mounting area 54, the fifth semiconductor chip mounting area 55, the first capacitor mounting area 61, the second capacitor mounting area 62, the third capacitor mounting area 63, and the fourth capacitor mounting area 64.

A surface treated layer 210, similar to the surface treated layer 110, may be formed on the upper surface of pad 23. In a case where a portion of the side surface and the upper surface of the pad 23 protrude from an upper surface 24a of the encapsulating resin layer 24, the surface treated layer 210 is formed only on the upper surface of the pad 23, or on the portion of the side surface and the upper surface of the pad 23.

A first slit 71, a second slit 72, a third slit 73, a fourth slit 74, and a fifth slit 75 are formed in the insulating layer 19. The first slit 71, the second slit 72, the third slit 73, the fourth slit 74, and the fifth slit 75 penetrate the insulating layer 19 in a thickness direction thereof, to expose the upper surface of the insulating layer 17. The first slit 71, the second slit 72, the third slit 73, the fourth slit 74, and the fifth slit 75 are not limited to the configuration penetrating the insulating layer, and may instead be a bottomed recess in the insulating layer 19 recessed to a bottom approximately at a center along the thickness direction of the insulating layer. In FIG. 4, the first slit 71, the second slit 72, the third slit 73, the fourth slit 74, and the fifth slit 75 are illustrated as slits 70.

In the plan view, the first slit 71 surrounds the first semiconductor chip mounting area 51, the second semiconductor chip mounting area 52, the third semiconductor chip mounting area 53, the fourth semiconductor chip mounting area 54, and the fifth semiconductor chip mounting area 55. The first slit 71 is also formed between the first semiconductor chip mounting area 51 and each of the second semiconductor chip mounting area 52, the third semiconductor chip mounting area 53, the fourth semiconductor chip mounting area 54, and the fifth semiconductor chip mounting area 55. In the plan view, the second slit 72 surrounds the first capacitor mounting area 61, the third slit 73 surrounds the second capacitor mounting area 62, the fourth slit 74 surrounds the third capacitor mounting area 63, and the fifth slit 75 surrounds the fourth capacitor mounting area 64.

The encapsulating resin layer 24 is laminated on the insulating layer 19 that is the uppermost insulating layer in the first interconnect structure 1H. The encapsulating resin layer 24 exposes the upper surface of the pad 23, and covers at least a portion of the side surface of the pad 23. The encapsulating resin layer 24 may expose the upper surface of the pad 23, and cover the entire side surface of the pad 23. In this case, the upper surface of the pad 23 coincides with the upper surface 24a of the encapsulating resin layer 24, for example. However, a portion of the side surface and the upper surface of the pad 23 may protrude from the upper surface 24a of the encapsulating resin layer 24, or the upper surface of the pad 23 may be exposed at a position recessed from the upper surface 24a of the encapsulating resin layer 24. In the case where the portion of the side surface and the upper surface of the pad 23 protrude from the upper surface 24a of the encapsulating resin layer 24, a gap can be secured between the encapsulating resin layer 24 and the semiconductor chip, to thereby facilitate filling of an underfill resin between the encapsulating resin layer 24 and the semiconductor chip. In addition, in the case where the upper surface of the pad 23 is exposed at the position recessed from the upper surface 24a of the encapsulating resin layer 24, it is possible to reduce flow-out of the solder, to thereby prevent the adjacent pads 23 from becoming short-circuited.

As described above, in the wiring board 1, the outer peripheral portion of the upper surface of the insulating layer 12 is exposed from the insulating layers 15, 17, and 19. That is, as illustrated in FIG. 4, a side surface 15S of the insulating layer 15, a side surface 17S of the insulating layer 17, and a side surface 19S of the insulating layer 19 are located at positions on an inner side of a side surface 12S of the insulating layer 12. Further, in the plan view illustrated in FIG. 3, a first area 76 where the upper surface of the insulating layer 12 is exposed, is located in a periphery of the insulating layers 15, 17, and 19.

The encapsulating resin layer 24 covers the outer peripheral portion of the upper surface of the insulating layer 12 exposed from the insulating layers 15, 17, and 19 in the first area 76. The encapsulating resin layer 24 also covers the side surface 15S of the insulating layer 15, the side surface 17S of the insulating layer 17, and the side surface 19S of the insulating layer 19.

In addition, the first slit 71, the second slit 72, the third slit 73, the fourth slit 74, and the fifth slit 75 formed in the insulating layer 19 are filled with the encapsulating resin layer 24.

For example, a mold resin may be used as the material forming the encapsulating resin layer 24. The mold resin is an insulating resin having a non-photosensitive thermosetting resin as a main component thereof, and can be used by transfer molding, compression molding, injection molding, or the like, for example. The mold resin is an insulating resin, such as the non-photosensitive thermosetting epoxy resin or the like, for example. The mold resin may include a filler, similar to the filler of the insulating layer 12, but does not include a reinforcing member, such glass fibers or the like.

From a viewpoint of reducing the warp of the wiring board 1, a thickness $T_3$ of the encapsulating resin layer 24 is preferably larger than the thickness $T_1$ of the insulating layer 12. The thickness $T_3$ of the encapsulating resin layer 24 refers to the thickness of the encapsulating resin layer 24 above the upper surface of the insulating resin layer 19. In a case where the thickness $T_1$ of the insulating layer 12 is in a range greater than or equal to 60 μm and less than or equal to 70 μm, the thickness $T_3$ of the encapsulating resin layer 24 may be in a range greater than or equal to 80 μm and less than or equal to 150 μm, for example. The thermal expansion coefficient of the encapsulating resin layer 24 is lower than the thermal expansion coefficient of each of the insulating layers 15, 17, and 19. For example, the thermal expansion coefficient of the encapsulating resin layer 24 is 20 ppm/K or lower, and the Young's modulus of the encapsulating resin layer 24 is 1 GPa or higher.

In addition, from a viewpoint of reducing the warp of the wiring board 1, the thermal expansion coefficient of the encapsulating resin layer 24 is preferably approximately equal to the thermal expansion coefficient of the insulating layer 12. In this specification, the thermal expansion coefficient of the encapsulating resin layer 24 is regarded as being approximately equal to the thermal expansion coefficient of the insulating layer 12, when the thermal expansion coefficient of the encapsulating resin layer 24 is ±20% or less with respect to the thermal expansion coefficient of the insulating layer 12.

For example, in a case where the thermal expansion coefficient of the insulating layer 12 is in a range higher than or equal to 5 ppm/K and lower than or equal to 10 ppm/K, the thermal expansion coefficient of the encapsulating resin layer 24 is preferably in a range higher than or equal to 5 ppm/K and lower than or equal to 10 ppm/K. The thermal expansion coefficient of the encapsulating resin layer 24 can be adjusted to a predetermined value by a filler content, a composition of the insulating resin, or the like, for example.

[Method for Manufacturing Wiring Board According to First Embodiment]

Next, a method for manufacturing the wiring board according to the first embodiment will be described. FIG. 5A through FIG. 13 are cross sectional views illustrating the method for manufacturing the wiring board according to the first embodiment. Processes or steps of manufacturing one wiring board will be illustrated and described. However, multiple parts that become wiring boards can be formed simultaneously, and the individual wiring boards can then be singulated to form each wiring board.

Figure 5A:
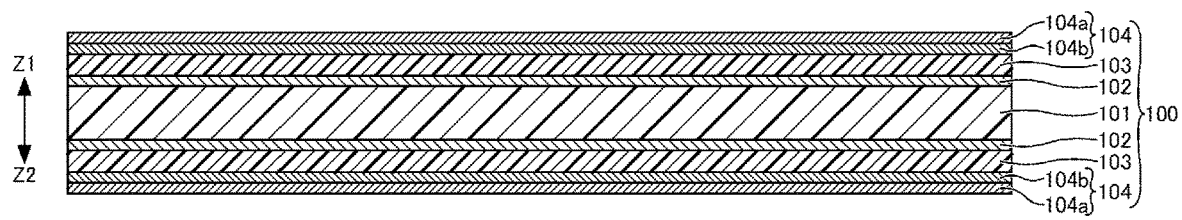
FIG. 5A, FIG. 5B, FIG. 5C, and FIG. 5D are cross sectional views (part 1) illustrating a method for manufacturing the wiring board according to the first embodiment.

First, as illustrated in FIG. 5A, a support body 100 is prepared. The support body 100 has a configuration formed by successively laminating a prepreg 103 and a carrier-attached copper film 104, on both sides of a core base 101 that has a copper film 102 formed on both sides thereof, for example. The core base 101 may be a glass epoxy base having a thickness of approximately 0.7 mm, for example, and a thickness of the copper film 102 may be in a range of approximately 7 µm to approximately 50 µm, for example. The prepreg 103 may be a woven or non-woven fabric, such as glass fibers, aramid fibers, or the like pre-impregnated with a thermosetting epoxy-based resin, a polyimide-based resin, or the like, for example.

The carrier-attached copper film 104 has a configuration including a thick film (carrier film) 104b made of copper and having a thickness in a range of approximately 10 µm to approximately 50 µm, for example, and a thin film 104a made of copper and having a thickness in a range of approximately 1.5 µm to approximately 5 µm, for example, strippably attached on the thick film 104b via a release layer (not illustrated). The thick film 104b is provided as a support material to facilitate handling of the thin film 104a. The thick film 104b is bonded to the copper film 102 of the core base 101 via the prepreg 103. The thin film 104a is disposed on the outermost layer on both sides of the support body 100.

The configuration of the support body 100 described above is merely an example, and the configuration of the support body 100 is not particularly limited. For example, the support body 100 may include multiple prepregs 103 that are laminated to form a laminated structure for use in place of the core base 101. In addition, the support body 100 may have a configuration including the carrier-attached copper film 104 disposed on both sides of the core base 101, such as a glass base, a metal base, or the like, via a release layer.

Figure 5B:
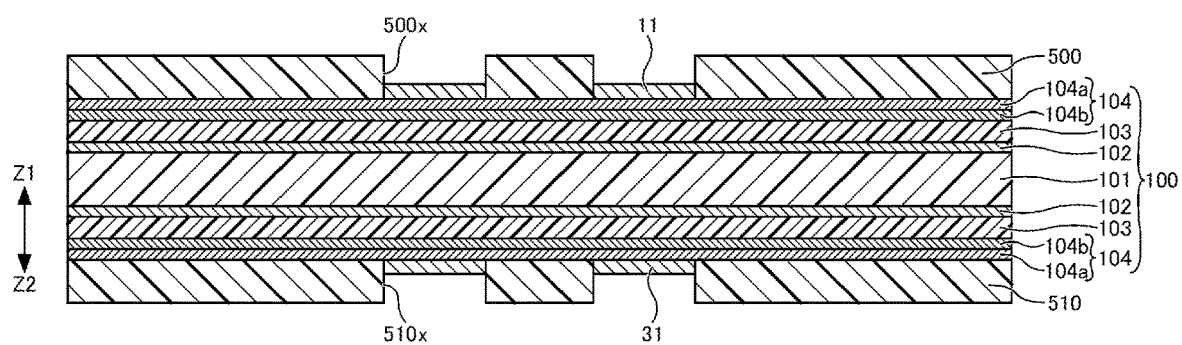

Next, as illustrated in FIG. 5B, a photosensitive resist layer 500 is formed on the entire upper surface (upper surface of the thin film 104a) of the upper carrier-attached copper film 104, and the photosensitive resist layer 500 is exposed and developed to form an opening 500x that exposes a portion where the interconnect layer 11 is to be formed. Similarly, a photosensitive resist layer 510 is formed on the entire lower surface (lower surface of the thin film 104a) of the lower carrier-attached copper film 104, and the photosensitive resist layer 510 is exposed and developed to form an opening 510x that exposes a portion where the interconnect layer 31 is to be formed. For example, a dry film resist may be used for the photosensitive resist layers 500 and 510. The opening 500x and the opening 510x are formed at positions opposing each other via the support body 100. Then, the upper carrier-attached copper film 104 is used as a power feed layer to form the interconnect layer 11, by electroplating, on the upper surface of the upper carrier-attached copper film 104 exposed inside the opening 500x. Similarly, the lower carrier-attached copper film 104 is used as a power feed layer to form the interconnect layer 31, by electroplating, on the lower surface of the lower carrier-attached copper film 104 exposed inside the opening 510x. The material and thickness of the interconnect layer 11 are as described above. The material and thickness of the interconnect layer 31 may be similar to those of the interconnect layer 11, for example.

Figure 5C:
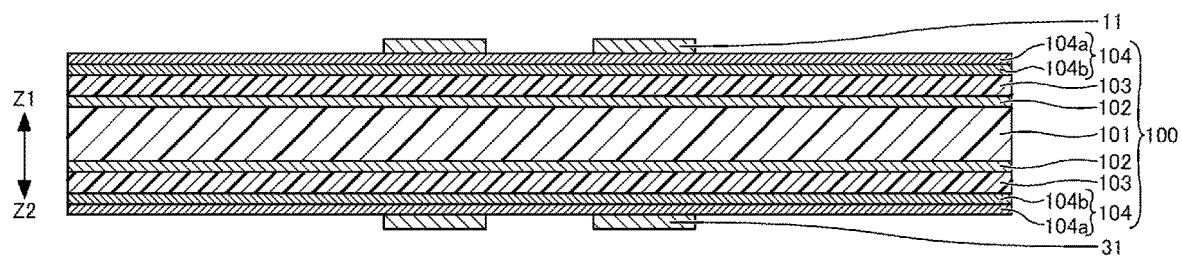
Figure 5D:
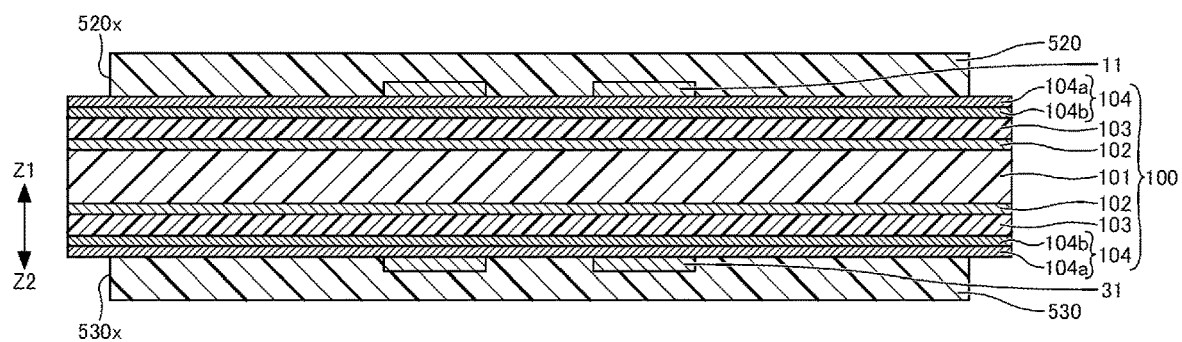

Next, as illustrated in FIG. 5C, the photosensitive resist layers 500 and 510 are stripped. Further, as illustrated in FIG. 5D, a photosensitive resist layer 520 is formed on the entire upper surface of the upper carrier-attached copper film 104 so as to cover the interconnect layer 11, and a photosensitive resist layer 530 is formed on the entire lower surface of the lower carrier-attached copper film 104 so as to cover the interconnect layer 31. For example, a dry film resist may be used for the photosensitive resist layers 520 and 530. Then, the photosensitive resist layer 520 is exposed and developed to form an opening 520x that exposes the outer peripheral portion of the upper carrier-attached copper film 104. In addition, the photosensitive resist layer 530 is exposed and developed to form an opening 530x that exposes the outer peripheral portion of the lower carrier-attached copper film 104. The opening 520x and the opening 530x are formed at positions opposing each other via the support body 100.

Figure 6A:
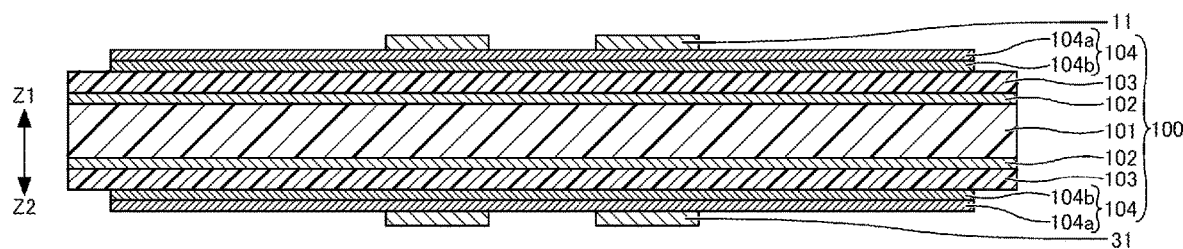
FIG. 6A, FIG. 6B, and FIG. 6C are cross sectional views (part 2) illustrating the method for manufacturing the wiring board according to the first embodiment.

Next, as illustrated in FIG. 6A, the upper carrier-attached copper film 104 exposed inside the opening 520x illustrated in FIG. 5D, and the lower carrier-attached copper film 104 exposed inside the opening 530x illustrated in FIG. 5D, are removed by etching. Hence, the upper surface of the upper prepreg 103 is exposed at the outer peripheral portion on one side (Z1-side) of the support body 100, and the lower surface of the lower prepreg 103 is exposed at the outer peripheral portion on the other side (Z2-side) of the support body 100. Thereafter, the photosensitive resist layers 520 and 530 are stripped. Moreover, the prepreg 103 is exposed at the outer peripheral portion on one side (Z1-side) of the support body 100, and the prepreg 103 is exposed at the outer peripheral portion on the other side (Z2-side) of the support body 100, in order to improve the adhesion of the prepregs 103 and the corresponding insulating layers 12 and 32 by providing areas where the prepregs 103 and the corresponding insulating layers 12 and 32 are in direct contact with each other without the carrier-attached copper film 104 interposed therebetween.

Figure 6B:
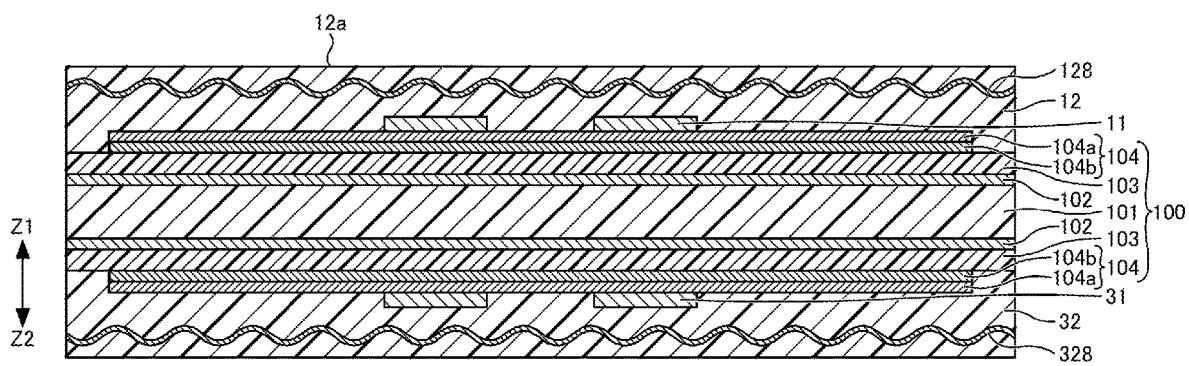

Next, as illustrated in FIG. 6B, the insulating layer 12 is formed on the upper surface of the upper prepreg 103, so as to cover the upper carrier-attached copper film 104 and the interconnect layer 11. In addition, the insulating layer 32 is formed on the lower surface of the lower prepreg 103, so as to cover the lower carrier-attached copper film 104 and the interconnect layer 31.

More particularly, an insulating resin having a non-photosensitive thermosetting resin as a main component thereof, in a semi-cured state and including the reinforcing member 128, is prepared in a form of a film. This insulating resin film is laminated on the upper surface of the upper carrier-attached copper film 104, and cured while heating and pressing, to form the insulating layer 12. The material, thickness, thermal expansion coefficient, or the like of the insulating layer 12 are as described above.

Similarly, an insulating resin having a non-photosensitive thermosetting resin as a main component thereof, in a semi-cured state and including the reinforcing member 128, is prepared in a form of a film. This insulating resin film is laminated on the lower surface of the lower carrier-attached copper film 104, and cured while heating and pressing, to form the insulating layer 32. The material, thickness, thermal expansion coefficient, or the like of the insulating layer 32 are as described above.

The processes or steps described above are merely an example. For example, a multi-layer film may be used in which an insulating resin having a non-photosensitive thermosetting resin as a main component thereof, in a semi-cured state and including the reinforcing member 128, is laminated on an insulating resin having a non-photosensitive thermosetting resin as a main component thereof, in a semi-cured state and not including a reinforcing member 128.

Figure 6C:
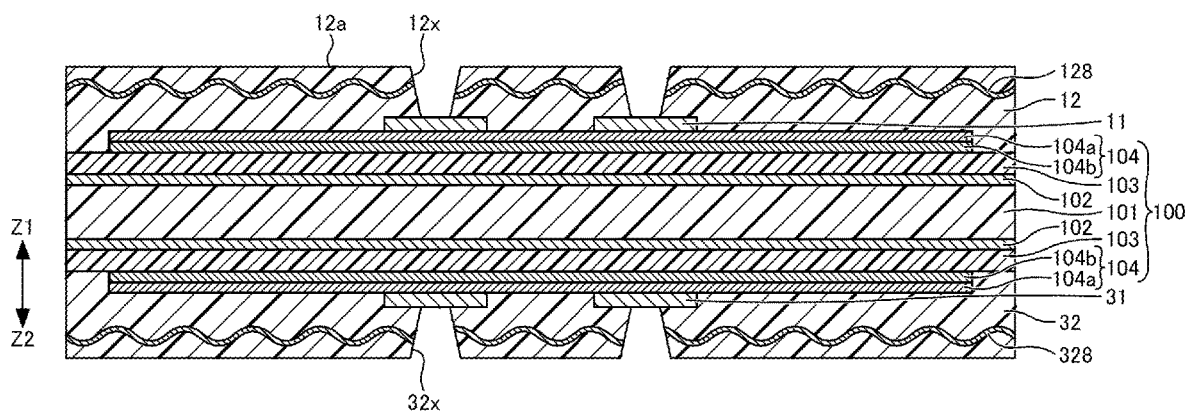

Next, as illustrated in FIG. 6C, the via hole 12x that penetrates the insulating layer 12 and exposes the upper surface of the interconnect layer 11, is formed in the insulating layer 12. Similarly, the via hole 32x that penetrates the insulating layer 32 and exposes the lower surface of the interconnect layer 31, is formed in the insulating layer 32. The via holes 12x and 32x can be formed by laser beam machining using a $CO_2$ laser, a YAG laser, an excimer laser, or the like, for example. After the via holes 12x and 32x are formed, a desmear process or step is performed to remove a resin residue adhered to the surfaces of the interconnect layers 11 and 31 exposed at the bottom of the via holes 12x and 32x, respectively.

Figure 7A:
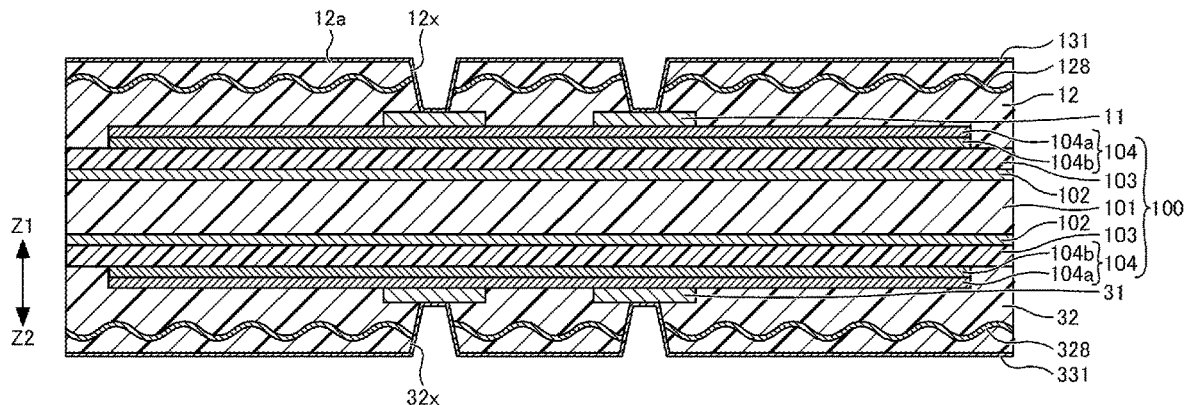
FIG. 7A, FIG. 7B, and FIG. 7C are cross sectional views (part 3) illustrating the method for manufacturing the wiring board according to the first embodiment.
Figure 7B:
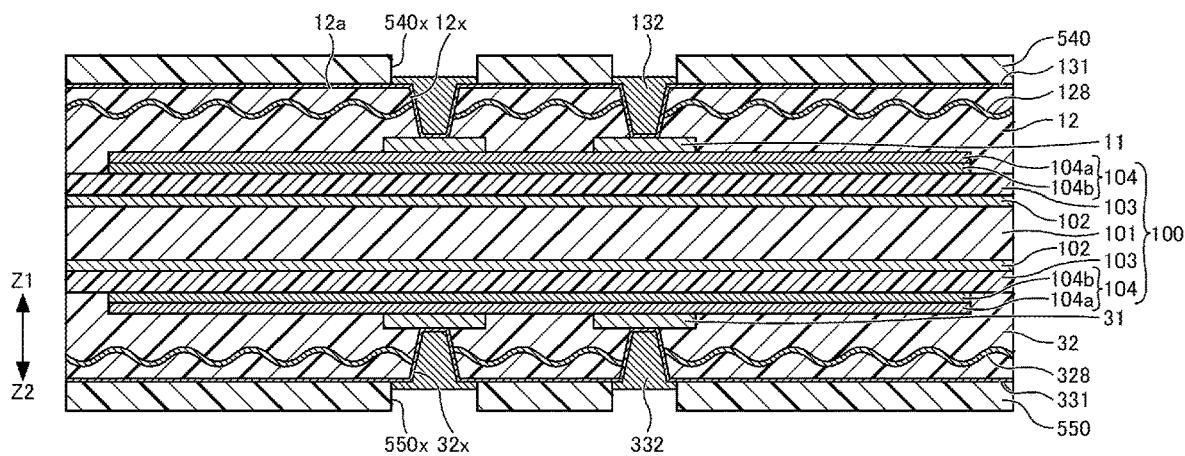
Figure 7C:
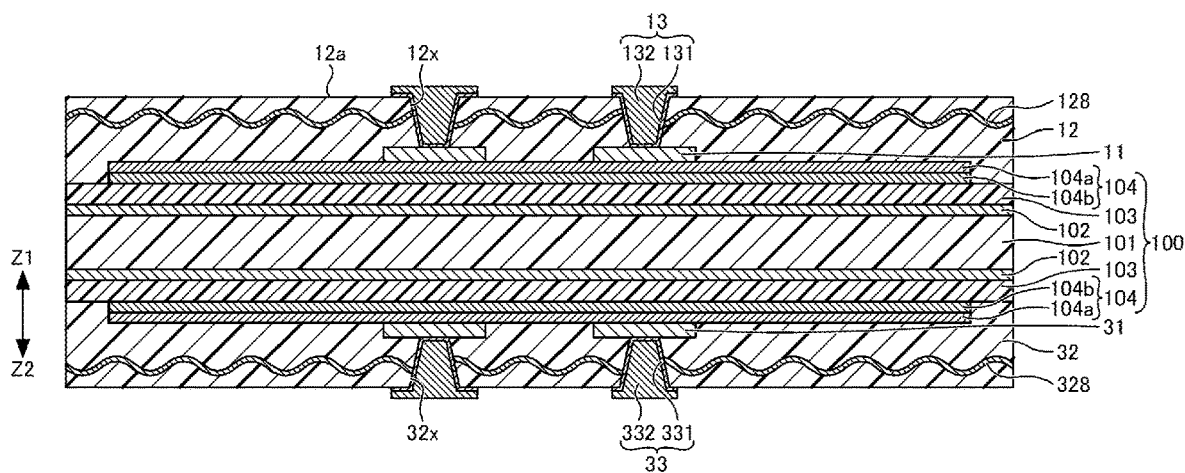

Next, as illustrated in FIG. 7A through FIG. 7C, the interconnect layers 13 and 33 are formed. The interconnect layers 13 and 33 can be formed using the semi-additive process, for example. More particularly, first, as illustrated in FIG. 7A, a seed layer 131 is formed on the surface of the insulating layer 12 including the inner wall of the via hole 12x, and the surface of the interconnect layer 11 exposed inside the via hole 12x, by electroless plating or sputtering. Similarly, a seed layer 331 is formed on the surface of the insulating layer 32 including an inner wall of the via hole 32x, and the surface of the interconnect layer 31 exposed inside the via hole 32x, by electroless plating or sputtering. A copper layer having a thickness in a range of approximately 100 nm to approximately 350 nm, for example, may be used as the seed layers 131 and 331. A laminated layer including a titanium layer having a thickness in a range of approximately 20 nm to approximately 50 nm, and a copper layer having a thickness in a range of approximately 100 nm to approximately 300 nm, for example, that are laminated in this order, may be used as the seed layers 131 and 331. By forming the titanium layer at a lower layer portion of each of the seed layers 131 and 331, it is possible to improve the adhesion between the insulating layer 12 and the interconnect layer 13, and the adhesion between the insulating layer 32 and the interconnect layer 33. Titanium nitride or the like may be used in place of the titanium. Titanium and titanium nitride are examples of a metal having a corrosion resistance higher than a corrosion resistance of copper.

Next, as illustrated in FIG. 7B, a photosensitive resist layer 540 is formed on the entire upper surface of the seed layer 131, and the photosensitive resist layer 540 is exposed and developed to form an opening 540x that exposes a portion where the interconnect layer 13 is to be formed. Similarly, a photosensitive resist layer 550 is formed on the entire lower surface of the seed layer 331, and the photosensitive resist layer 550 is exposed and developed to form an opening 550x that exposes a portion where the interconnect layer 33 is formed. For example, a dry film resist may be used for the photosensitive resist layers 540 and 550. The opening 540x and the opening 550x are formed at positions opposing each other via the support body 100. Then, the seed layer 131 is used as a power feed layer to form an electroplating layer 132 (for example, a copper layer), by electroplating, on the upper surface of the seed layer 131 exposed inside the opening 540x. Similarly, the seed layer 331 is used as a power feed layer to form an electroplating layer 332 (for example, a copper layer), by electroplating, on the lower surface of the seed layer 331 exposed inside the opening 550x.

Next, as illustrated in FIG. 7C, after the photosensitive resist layer 540 is stripped, the electroplating layer 132 is used as a mask to etch and remove a portion of the seed layer 131 that is not covered by the electroplating layer 132. As a result, the interconnect layer 13, having the electroplating layer 132 laminated on the seed layer 131, is formed. Similarly, after the photosensitive resist layer 550 is stripped, the electroplating layer 332 is used as a mask to etch and remove a portion of the seed layer 331 that is not covered by the electroplating layer 332. As a result, the interconnect layer 33, having the electroplating layer 332 laminated on the seed layer 331, is formed.

A layer structure in which the insulating layer and the interconnect layer are arranged symmetrically above and below the support body 100 is formed by the steps or processes described above. By using such a layer structure having the vertically symmetrical configuration, physical properties (elastic modulus and thermal expansion coefficient) can be balanced above and below the support body 100, thereby making it possible to reduce the warp from being generated during the manufacturing steps or processes of the wiring board 1. Although the lower layer structure is not used as a product of the wiring board in this example, the lower layer structure may be completed and used as a product of the wiring board 1. Further, in a case where the warp of the structure during the manufacturing steps or processes of the wiring board 1 is negligible, the lower layer structure below the support body 100 does not need to be formed and may be omitted.

Figure 8A:
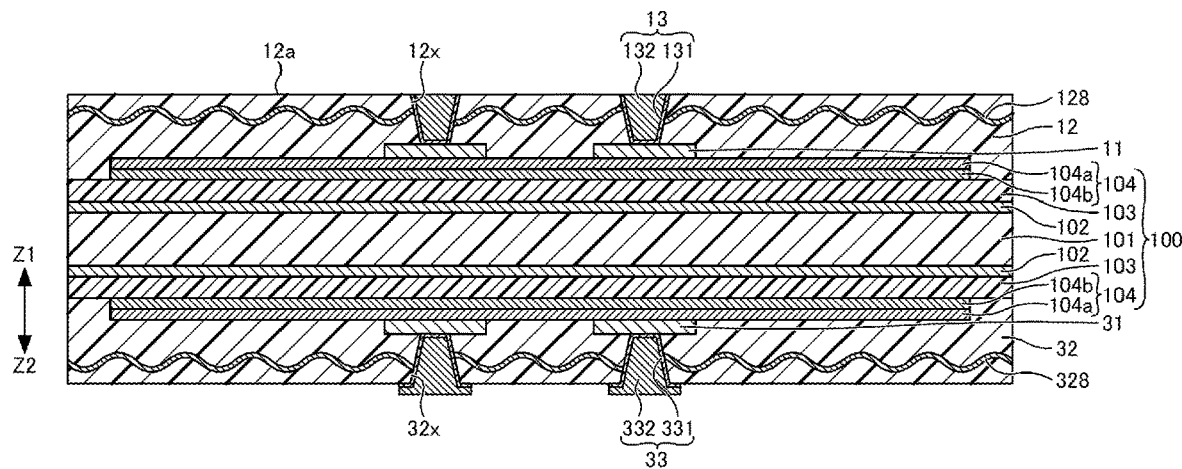
FIG. 8A, FIG. 8B, and FIG. 8C are cross sectional views (part 4) illustrating the method for manufacturing the wiring board according to the first embodiment.

Next, as illustrated in FIG. 8A, the upper surface of the interconnect layer 13 is polished to expose the upper surface 12a of the insulating layer 12 and the upper surface of the interconnect layer 13 filling the inside of the via hole 12x, to thereby form the interconnect layer 13 that is the via interconnect filling the inside of the via hole 12x. A chemical mechanical polishing (CMP) or the like, for example, may be used for the polishing of the interconnect layer 13. The upper surface of the interconnect layer 13 may coincide with the upper surface 12a of the insulating layer 12, for example.

When polishing the interconnect layer 13, a portion of the upper surface 12a of the insulating layer 12 may be polished and removed simultaneously therewith. By polishing the upper surface 12a of the insulating layer 12 together with the interconnect layer 13 and removing a portion of the upper surface 12a of the insulating layer 12, the roughness of the upper surface 12a of the insulating layer 12 can be reduced compared to the roughness of the upper surface 12a before the polishing. That is, the smoothness of the upper surface 12a of the insulating layer 12 can be improved. The roughness of the upper surface 12a of the insulating layer 12 before being polished, represented by the value of the surface roughness Ra, may be set in a range of approximately 300 nm to approximately 400 nm, for example. The roughness of the upper surface 12a of the insulating layer 12 after being polished, represented by the value of the surface roughness Ra, may be set in a range of approximately 15 nm to approximately 40 nm, for example. As described above, by reducing the roughness of the upper surface 12a of the insulating layer 12 and improving the smoothness thereof, a micro interconnect (interconnect layer having a high interconnect density) can be formed in a subsequent step or process. The roughness of the lower surface 12b of the insulating layer 12, represented by the value of the surface roughness Ra, may be set in a range of approximately 180 nm to approximately 280 nm, for example.

Figure 8B:
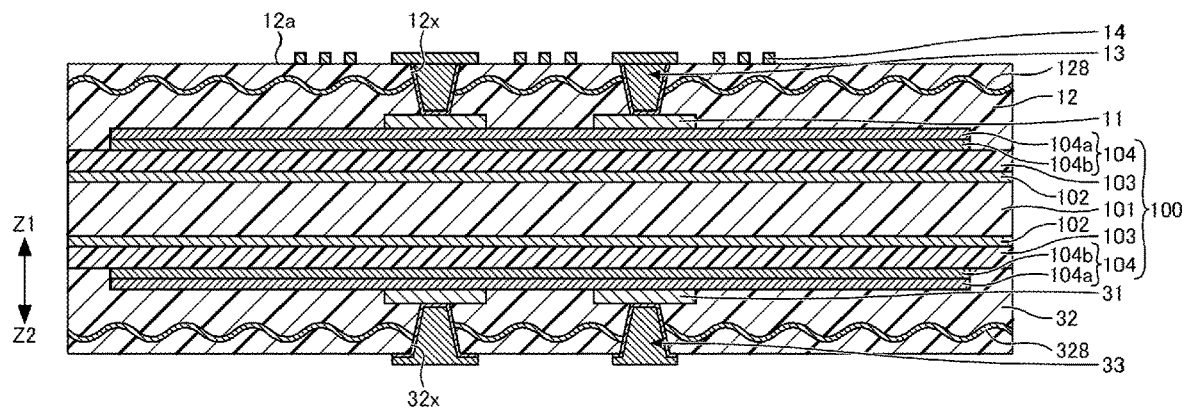

Next, as illustrated in FIG. 8B, the interconnect layer 14 is formed. The interconnect layer 14 can be formed using the semi-additive process, for example, similar to the interconnect layers 13 and 33. More particularly, a seed layer is first formed by electroless plating or sputtering, so as to continuously cover the upper surface of the interconnect layer 13 and the upper surface 12a of the insulating layer 12. Although the electroless plating may be used to form the seed layer, a thinner film can be formed using the sputtering, thereby making it is more advantageous to use the sputtering in order to increase the density of the interconnect layer.

Next, a photosensitive resist layer is formed on the entire upper surface of the seed layer, and the resist layer is exposed and developed to form an opening that exposes a portion where the interconnect layer 14 is to be formed. Then, the seed layer is used as a power feed layer to form an electroplating layer, by electroplating, on the upper surface of the seed layer exposed inside the opening. Further, after the resist layer is stripped, the electroplating layer is used as a mask to etch and remove a portion of the seed layer not covered by the electroplating layer. As a result, the interconnect layer 14, having the electroplating layer laminated on the seed layer, is formed. The material, thickness, line/space, or the like of the interconnect layer 14 are as described above. The interconnect layer 14 has a structure in which the electroplating layer is laminated on the seed layer, but in FIG. 8B or the like, a distinction between the seed layer and the electroplating layer is omitted, and similar omissions may be made for the other interconnect layers.

Figure 8C:
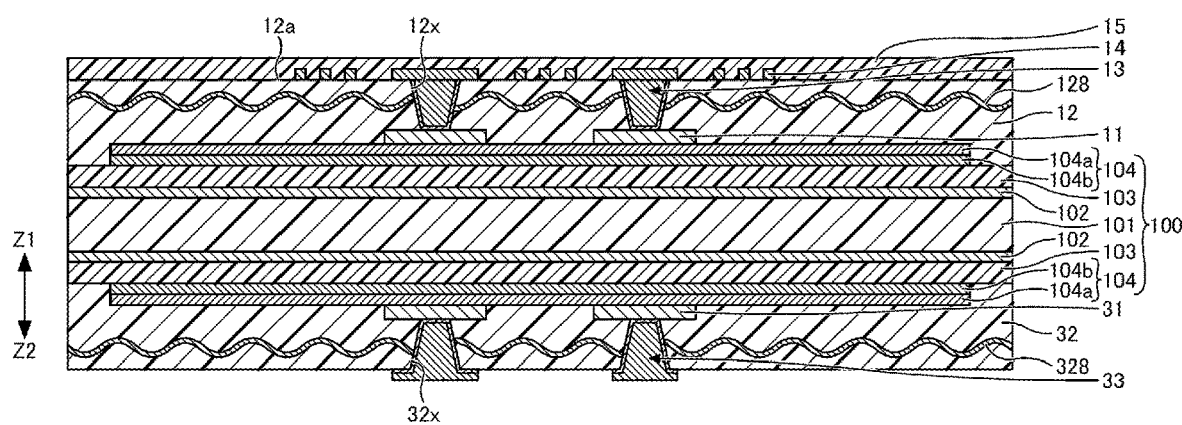

Next, as illustrated in FIG. 8C, a photosensitive insulating resin in liquid or paste form is coated on the upper surface 12a of the insulating layer 12, so as to cover the interconnect layer 14, and the insulating layer 15 in a semi-cured state is thereafter formed by heating to a temperature that does not cause complete curing. The material and thickness of the insulating layer 15 are as described above.

Figure 9A:
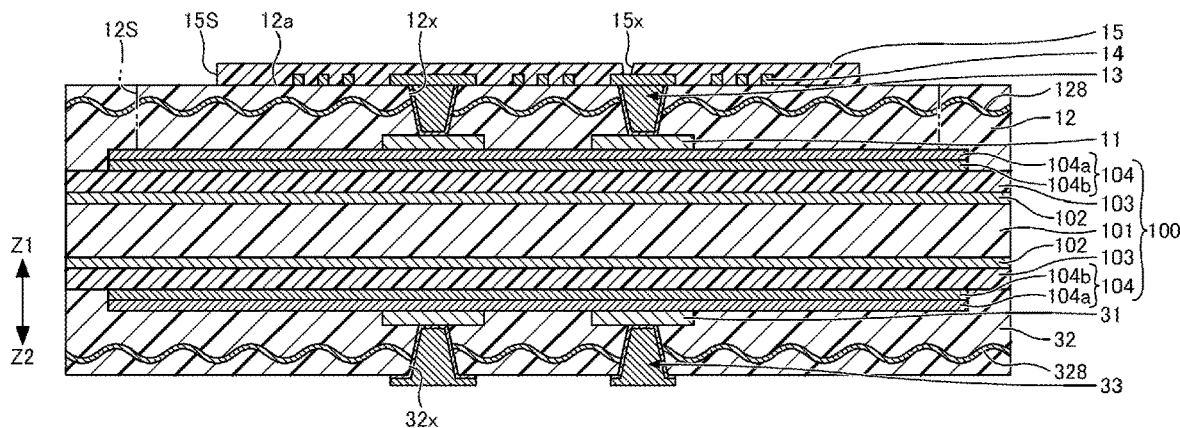
FIG. 9A, FIG. 9B, and FIG. 9C are cross sectional views (part 5) illustrating the method for manufacturing the wiring board according to the first embodiment.

Next, as illustrated in FIG. 9A, the via hole 15x is formed by photolithography, for example, and the insulating layer 15 is thereafter heated to a temperature higher than or equal to a curing temperature to cure the insulating layer 15. When forming the via hole 15x, the insulating layer 15 is removed from above the outer peripheral portion of the upper surface of the insulating layer 12, and the side surface 15S of the insulating layer 15 is positioned on the inner side of the side surface 12S of the insulating layer 12. The side surface 12S of the insulating layer 12 is the side surface of the insulating layer 12 that is exposed when the insulating layer 12 is cut in a subsequent dicing step or process. The upper surface of the insulating layer 15 having the photosensitive insulating resin as the main component thereof is even smoother than the upper surface 12a of the insulating layer 12. The roughness of the upper surface of the insulating layer 15, represented by the value of the surface roughness Ra, may be set in a range of approximately 2 nm to approximately 6 nm, for example.

Figure 9B:
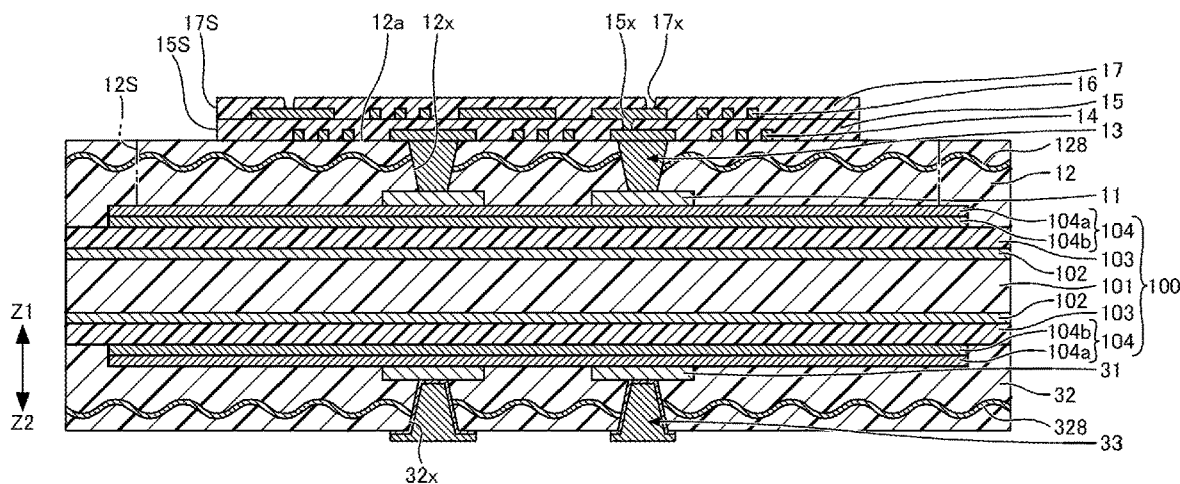

Next, as illustrated in FIG. 9B, the interconnect layer 16 is formed. The interconnect layer 16 can be formed using the semi-additive process, for example, similar to the interconnect layer 14. Then, a photosensitive insulating resin in liquid or paste form is coated on the upper surface of the insulating layer 15, so as to cover the interconnect layer 16, and the insulating layer 17 in a semi-cured state is thereafter formed by heating to a temperature that does not cause complete curing. The material and thickness of the insulating layer 17 are as described above.

Next, the via hole 17x is formed by photolithography, for example, and the insulating layer 17 is thereafter heated to a temperature higher than or equal to a curing temperature to cure the insulating layer 17. When forming the via hole 17x, the insulating layer 17 is removed from above the outer peripheral portion of the upper surface of the insulating layer 12, and the side surface 17S of the insulating layer 17 is positioned on the inner side of the side surface 12S of the insulating layer 12. The upper surface of the insulating layer 17 having the photosensitive insulating resin as the main component thereof is even smoother than the upper surface 12a of the insulating layer 12. The roughness of the upper surface of the insulating layer 17, represented by the value of the surface roughness Ra, may be set in a range of approximately 2 nm to approximately 6 nm, for example.

Figure 9C:
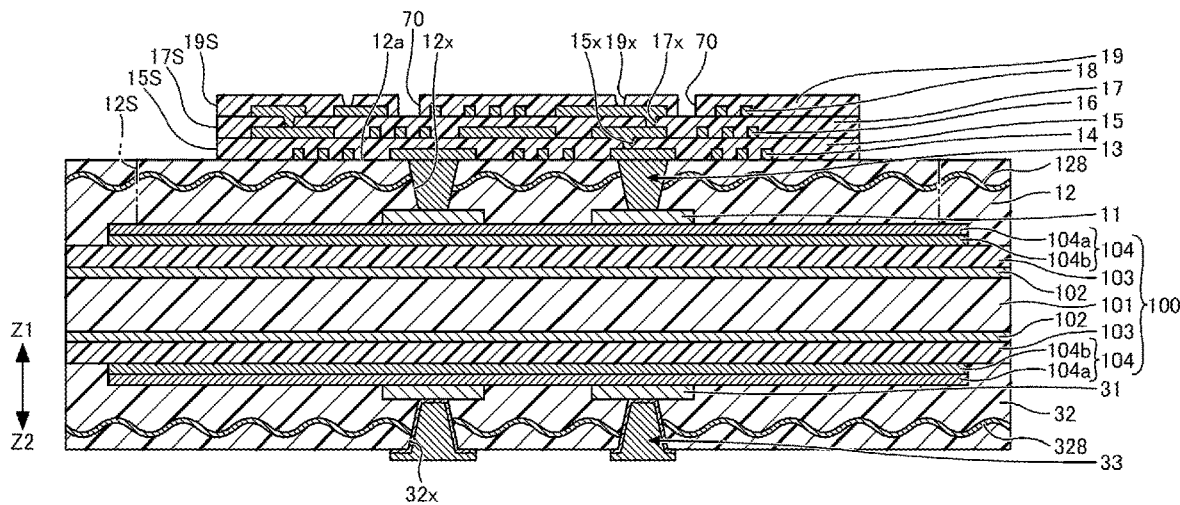

Next, as illustrated in FIG. 9C, the interconnect layer 18 is formed. The interconnect layer 18 can be formed using the semi-additive process, for example, similar to the interconnect layer 14. Then, a photosensitive insulating resin in liquid or paste form is coated on the upper surface of the insulating layer 17, so as to cover the interconnect layer 18, and the insulating layer 19 in a semi-cured state is thereafter formed by heating to a temperature that does not cause complete curing. The material and thickness of the insulating layer 19 are as described above.

Next, the via hole 19x and the slit 70 are formed by photolithography, for example, and the insulating layer 19 is thereafter heated to a temperature higher than or equal to a curing temperature to cure the insulating layer. When forming the via hole 19x and the slit 70, the insulating layer 19 is removed from above the outer peripheral portion of the upper surface of the insulating layer 12, and the side surface 19S of the insulating layer 19 is positioned on the inner side of the side surface 12S of the insulating layer 12. The upper surface of the insulating layer 19 having the photosensitive insulating resin as the main component thereof, is even smoother than the upper surface 12a of the insulating layer 12. The surface roughness of the upper surface of the insulating layer 19, represented by the value of the surface roughness Ra, may be set in a range of approximately 2 nm to approximately 6 nm, for example.

Figure 10A:
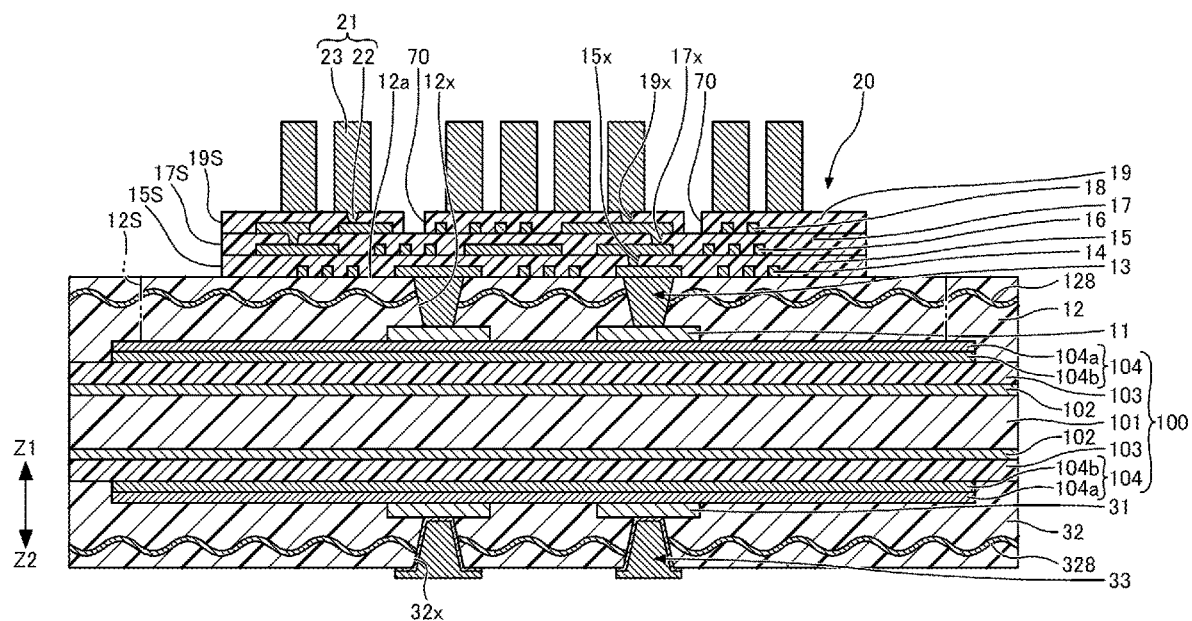
FIG. 10A and FIG. 10B are cross sectional views (part 6) illustrating the method for manufacturing the wiring board according to the first embodiment.

Next, as illustrated in FIG. 10A, the interconnect layer 21, that includes the via interconnect 22 and the pad 23, is formed. The interconnect layer 21 can be formed using the semi-additive process, for example, similar to the interconnect layer 14.

Figure 10B:
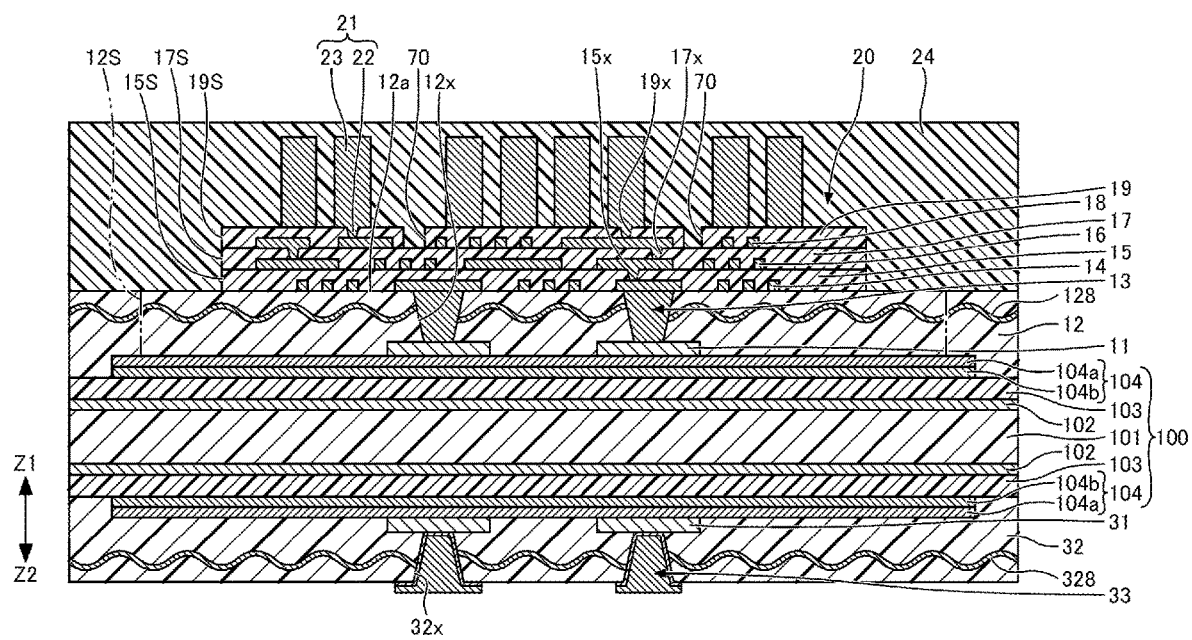

Next, as illustrated in FIG. 10B, the encapsulating resin layer 24 is formed on the insulating layer 12, so as to cover the upper surface and the side surface of the pad 23 of the interconnect layer 21, and an upper surface and a side surface of a laminated structure 20 of the insulating layers 15, 17, and 19. The encapsulating resin layer 24 can be formed by a molding process using the mold resin, for example. For example, the structure illustrated in FIG. 10A is accommodated inside a mold, and a pressure (in a range of 5 MPa to 10 MPa, for example) is applied to introduce the fluidized mold resin into the mold. Thereafter, the mold resin is heated to a temperature of approximately 180° C. and cured to form the encapsulating resin layer 24. After a required encapsulating process ends, the structure covered with the encapsulating resin layer 24 is removed from the mold. Examples of the molding process include transfer molding, compression molding, injection molding, or the like, for example.

Figure 11A:
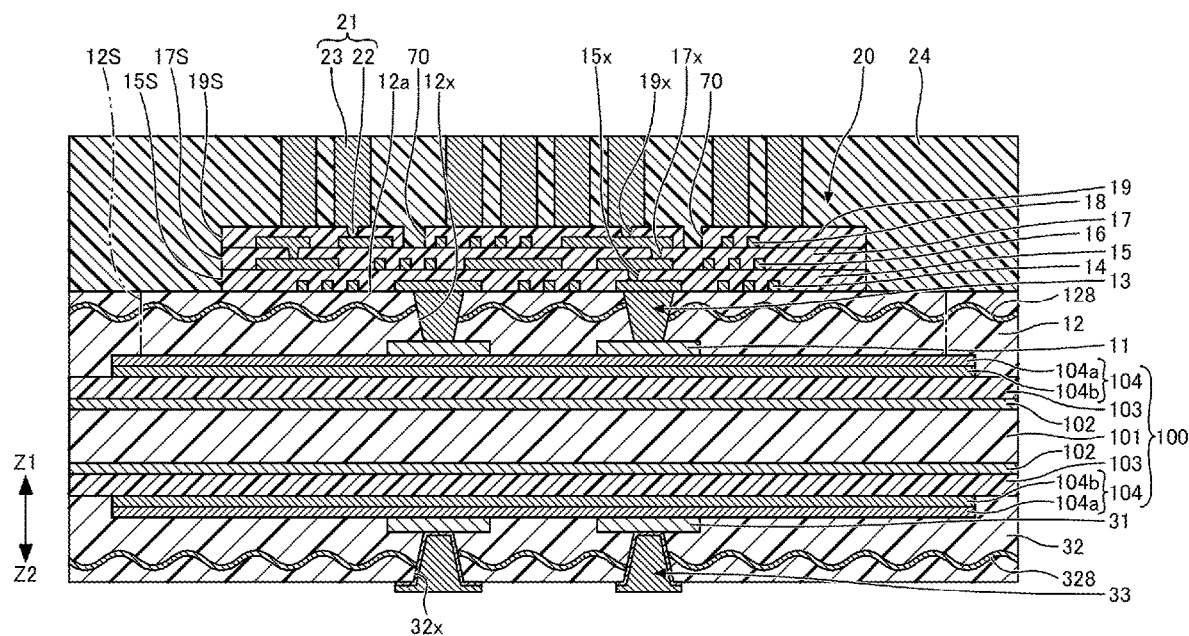
FIG. 11A and FIG. 11B are cross sectional views (part 7) illustrating the method for manufacturing the wiring board according to the first embodiment.

Next, as illustrated in FIG. 11A, the upper surface of the encapsulating resin layer 24 illustrated in FIG. 10B is polished to expose at least the upper surface of the pad 23. For example, the CMP or the like may be used for the polishing of the encapsulating resin layer 24. The upper surface of the pad 23 may coincide with the upper surface 24a of the encapsulating resin layer 24, for example. However, a portion of the side surface and the upper surface of the pad 23 may protrude from the upper surface 24a of the encapsulating resin layer 24, or the upper surface of the pad 23 may be exposed at a position recessed from the upper surface 24a of the encapsulating resin layer 24, by adjusting the amount of polishing or the like of the encapsulating resin layer 24.

Figure 11B:
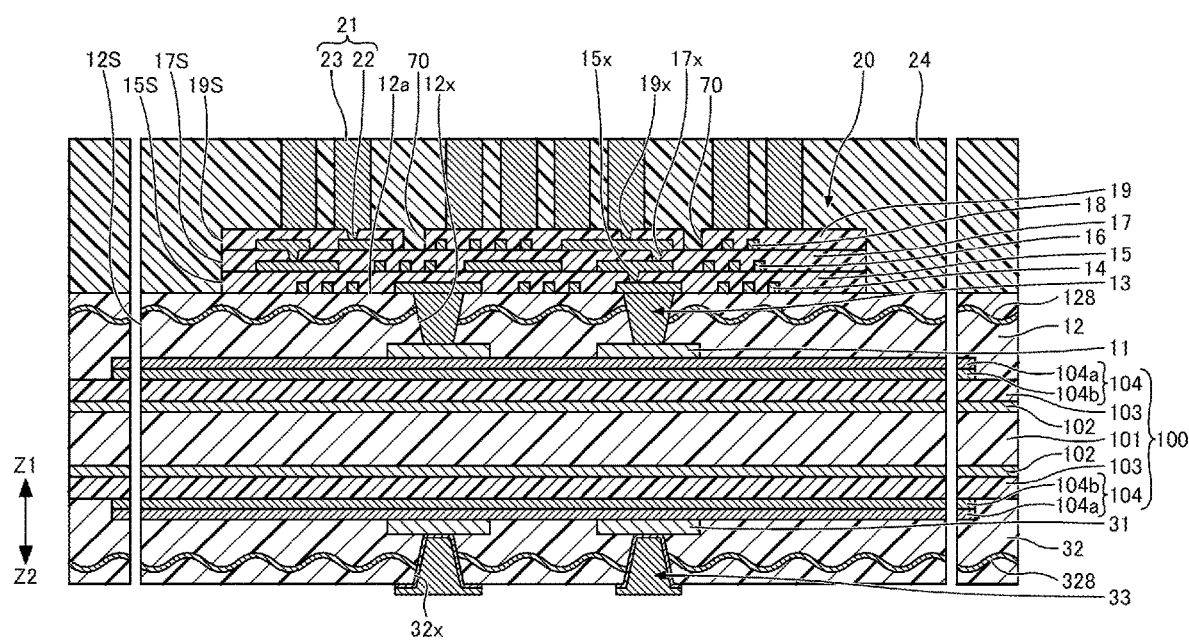
Figure 12A:
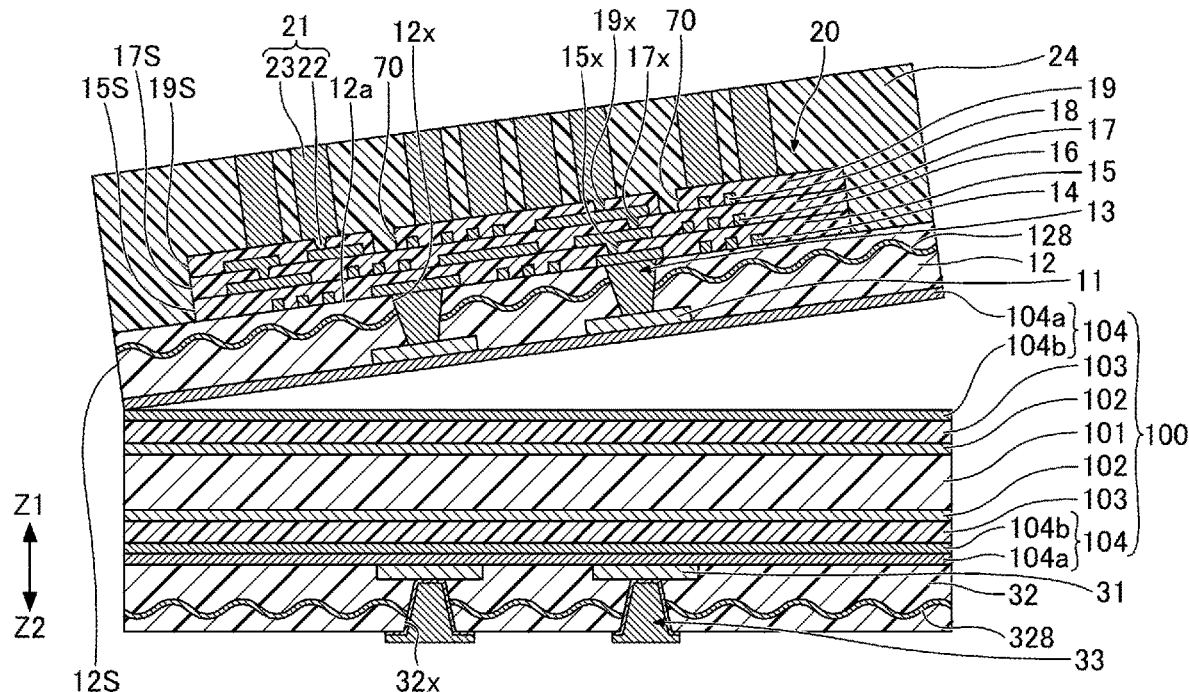
FIG. 12A and FIG. 12B are cross sectional views (part 8) illustrating the method for manufacturing the wiring board according to the first embodiment.

Next, as illustrated in FIG. 11B, an outer peripheral portion of the structure illustrated in FIG. 11A is cut using a dicing blade or the like. The structure is cut so as to remove a region where the insulating layer 12 and the upper prepreg 103 are in direct contact with each other, and a region where the insulating layer 32 and the lower prepreg 103 are in direct contact with each other. Hence, as illustrated in FIG. 12A, it becomes possible to easily strip the portion where the thick film 104b and the thin film 104a are in contact with each other. That is, a major portion of the support body 100 can easily be removed.

Figure 12B:
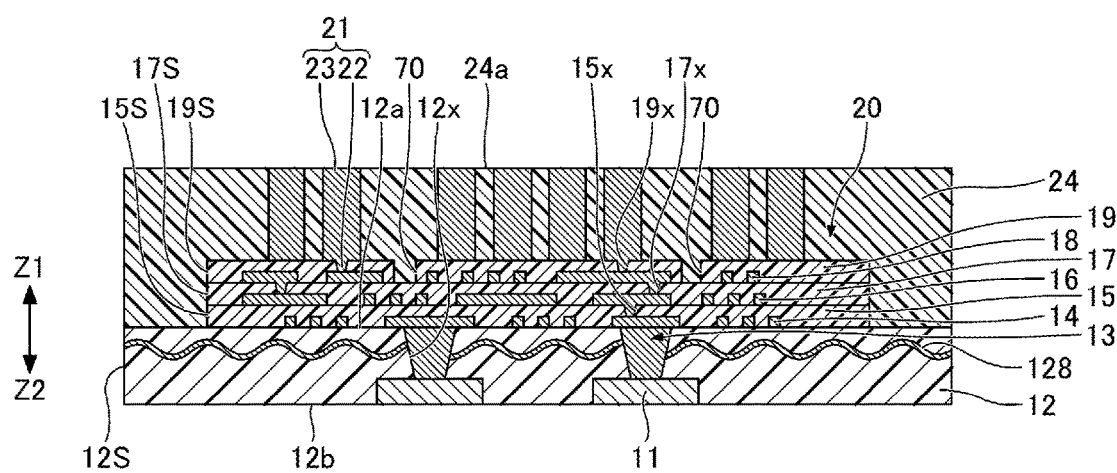

Next, as illustrated in FIG. 12B, the thin film 104a is removed from the structure (the part illustrated in FIG. 12A at an angle) corresponding to the support body 100 illustrated in FIG. 12A having the major portion thereof removed. The thin film 104a can be removed by wet etching, for example. As a result, the lower surface of the interconnect layer 11 becomes exposed at the lower surface 12b of the insulating layer 12. The lower surface 12b of the insulating layer 12 and the lower surface of the interconnect layer 11 may coincide, for example.

Figure 13:
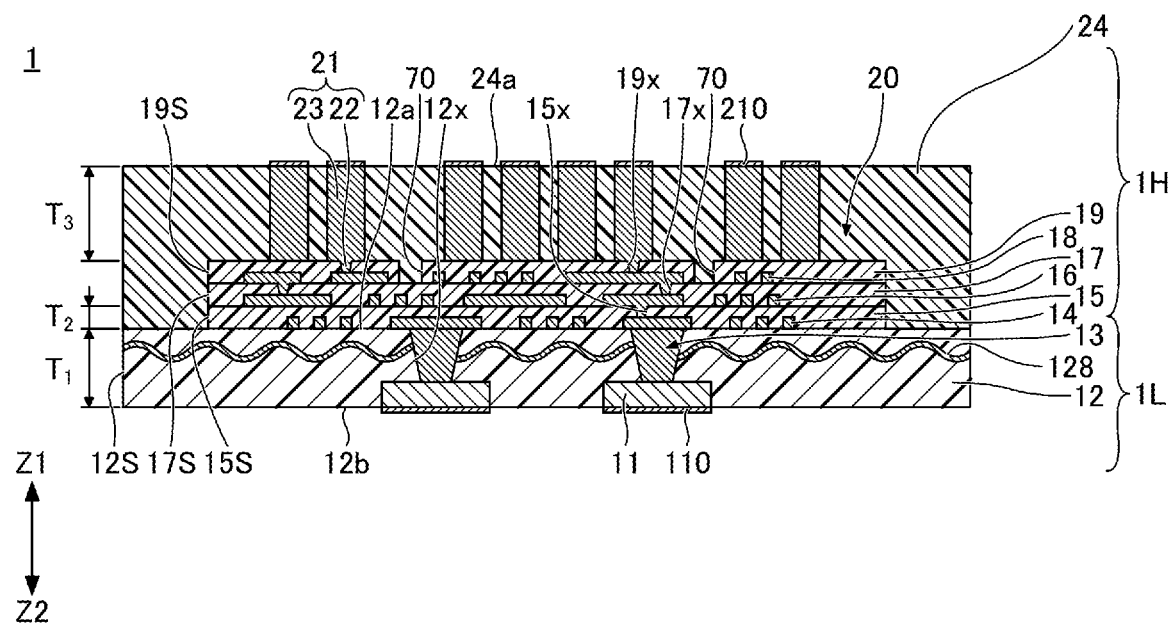
FIG. 13 is a cross sectional view (part 9) illustrating the method for manufacturing the wiring board according to the first embodiment.

Next, as illustrated in FIG. 13, the surface treated layer 210 is formed on the upper surface of the pad 23 of the structure illustrated in FIG. 12B, and the surface treated layer 110 is formed on the lower surface of the interconnect layer 11, as required. The surface treated layers 110 and 210 may be formed by electroless plating to form the metal layer or the laminated structure of metal layers, or may be formed by the antioxidation treatment, such as the OSP treatment or the like.

The wiring board 1 according to the first embodiment can be manufactured by the steps of processes described above.

As described above, in the wiring board 1, the second interconnect structure 1L that includes the insulating layer 12 having the non-photosensitive thermosetting resin as the main component thereof, and the encapsulating resin layer 24 having the non-photosensitive thermosetting resin as the main component thereof, are disposed to sandwich therebetween the first interconnect structure 1H that includes the insulating layers 15, 17, and 19 having the photosensitive resin as the main component thereof. In addition, the thermal expansion coefficient of the insulating layer 12 and the thermal expansion coefficient of the encapsulating resin layer 24 are lower than the thermal expansion coefficient of each of the insulating layers 15, 17, and 19. Because this structure improves the imbalance of the thermal expansion coefficient in the thickness direction of the wiring board 1, it is possible to reduce the warp of the wiring board 1.

Further, the encapsulating resin layer 24 covers the side surface 15S of the insulating layer 15, the side surface 17S of the insulating layer 17, and the side surface 19S of the insulating layer 19. Accordingly, the portion of the encapsulating resin layer 24 on the outer side of the side surfaces 15S, 17S, and 19S is thicker than the portion where the pad 23 is formed (the portion above the upper surface of the insulating layer 19). For this reason, a volume of the encapsulating resin layer 24 on the upper side (Z1-side) of the insulating layer 12 is large compared to the wiring board 9, and the warp of the wiring board 1 can be reduced compared to the warp of the wiring board 9.

Moreover, the first slit 71, the second slit 72, the third slit 73, the fourth slit 74, and the fifth slit 75 are filled with the encapsulating resin layer 24. Hence, also from this viewpoint, compared to the wiring board 9, the volume of the encapsulating resin layer 24 on the upper side (Z1-side) of the insulating layer 12 is large, and the warp of the wiring board 1 can be reduced compared to the warp of the wiring board 9.

In addition, because the warp of the wiring board 1 is reduced, it becomes easy to mount the semiconductor chip on the side of the encapsulating resin layer 24 of the wiring board 1, and to mount the wiring board 1 on another wiring board.

The encapsulating resin layer 24 does not need to cover all of the side surface 15S of the insulating layer 15, the side surface 17S of the insulating layer 17, and the side surface 19S of the insulating layer 19, and may cover only a portion of the side surfaces 15A, 17S, and 19S. For example, in the plan view, the side surface 15S of the insulating layer 15 may overlap the side surface 12S of the insulating layer 12, and the encapsulating resin layer 24 may cover the side surface 15S of the insulating layer 15 and the side surface 17S of the insulating layer 17 without covering the side surface 15S of the insulating layer 15.

The wiring board 1 in the state illustrated in FIG. 11A may be the product that is forwarded. That is, the wiring board 1, attached with the support body 100, may be the product that is forwarded.

Second Embodiment

Next, a second embodiment will be described. The second embodiment differs from the first embodiment in that the wiring board according to the second embodiment does not include the second interconnect structure 1L.

[Structure of Wiring Board According to Second Embodiment]

Figure 14:
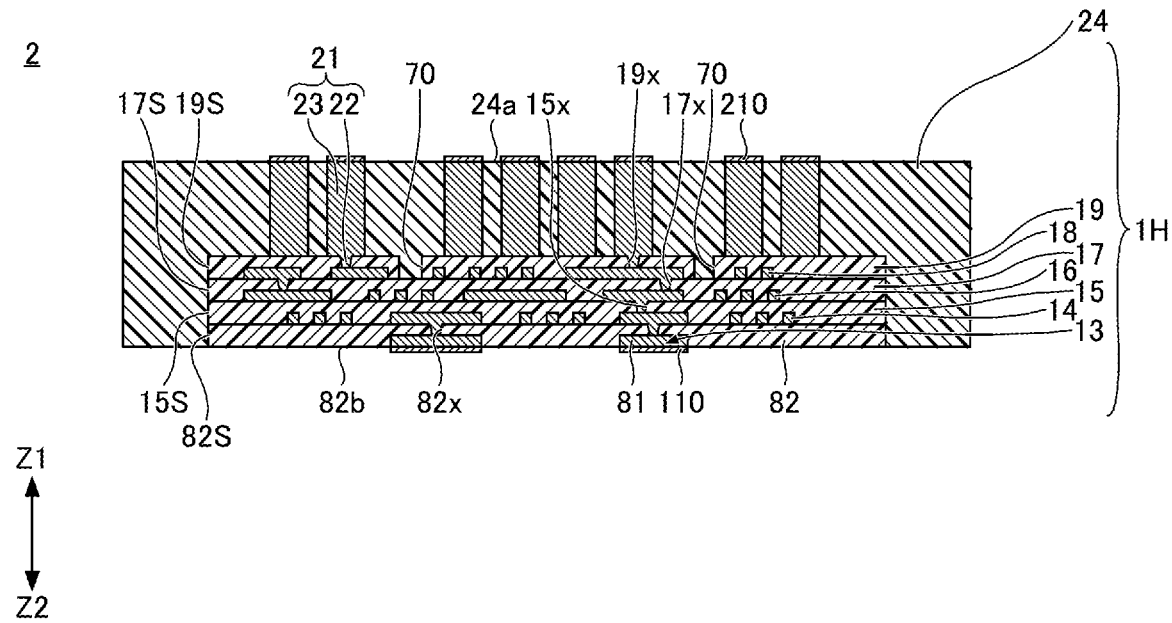
FIG. 14 is a cross sectional view illustrating the wiring board according to a second embodiment.

FIG. 14 is a cross sectional view illustrating the wiring board according to the second embodiment. As illustrated in FIG. 14, a wiring board 2 according to the second embodiment includes the first interconnect structure 1H, but does not include the second interconnect structure 1L.

The first interconnect structure 1H includes an interconnect layer 81 and an insulating layer 82, in addition to the interconnect layer 14, the insulating layer 15, the interconnect layer 16, the insulating layer 17, the interconnect layer 18, the insulating layer 19, and the interconnect layer 21.

The interconnect layer 81 is the lowermost interconnect layer that is exposed at a lower surface 82b of the insulating layer 82, and an upper surface and a side surface of the interconnect layer 81 are covered with the insulating layer 82. The lower surface of the interconnect layer 81 may coincide with the lower surface 82b of the insulating layer 82, for example. A lower surface of the interconnect layer 81 may be exposed at a position recessed toward the interconnect layer 14 from the lower surface 82b of the insulating layer 82. Alternatively, a portion of the side surface and the lower surface of the interconnect layer 81 may protrude downward from the lower surface 82b of the insulating layer 82.

The interconnect layer 81 is a pad having a planar shape that is a circular shape with a diameter of approximately 150 μm, but may include an interconnect pattern. A space width between mutually adjacent interconnect layers 81 may be approximately 200 μm, for example. For example, a material, such as copper (Cu) or the like, may be used for the interconnect layer 81. A thickness of the interconnect layer 81 may be in a range of approximately 1 μm to approximately 3 μm, for example. The interconnect layer 81 can be used as an external connection terminal (pad) for electrically connecting to another wiring board. The interconnect layer 81 may be used as an external connection terminal (pad) for electrically connecting to the chip capacitor or the like. The surface treated layer 110 may be formed on the lower surface of the interconnect layer 81.

The insulating layer 82 covers the upper surface and the side surface of the interconnect layer 81. In the plan view, an edge of the insulating layer 82 overlaps the edges of the insulating layers 15, 17, and 19. The material, thickness, and thermal expansion coefficient of the insulating layer 82 may be similar to those of the insulating layer 15, for example. The insulating layer 17 may include a filler, such as silica ($SiO_2$) or the like.

In this embodiment, the interconnect layer 14 is formed on one side (Z1-side) of the insulating layer 82, and is electrically connected to the interconnect layer 81. The interconnect layer 14 includes a via interconnect filling the inside of a via hole 82x that penetrates the insulating layer 82 to expose the upper surface of interconnect layer 81, and an interconnect pattern formed on the upper surface of insulating layer 15. The via hole 82x may be a cavity having an inverted truncated cone shape, and a diameter of an opening of the cavity at one end which opens to the insulating layer 15 is greater than a diameter of the opening at the other end at a bottom surface of the cavity formed by the upper surface of the interconnect layer 81. A diameter of the opening of the cavity of the via hole 82x, that opens at the one end to the insulating layer 15, may be in a range of approximately 10 μm to approximately 20 μm, for example.

The encapsulating resin layer 24 covers a side surface 82S of the insulating layer 82, in addition to the side surface 15S of the insulating layer 15, the side surface 17S of the insulating layer 17, and the side surface 19S of the insulating layer 19. The lower surface of the encapsulating resin layer 24 may coincide with the lower surface 82b of the insulating layer 82.

Other configurations of the second embodiment are similar to those of the first embodiment.

[Method for Manufacturing Wiring Board According to Second Embodiment]

Next, the method for manufacturing the wiring board according to the second embodiment will be described. FIG. 15A through FIG. 16B are cross sectional views illustrating the method for manufacturing the wiring board according to the second embodiment.

Figure 15A:
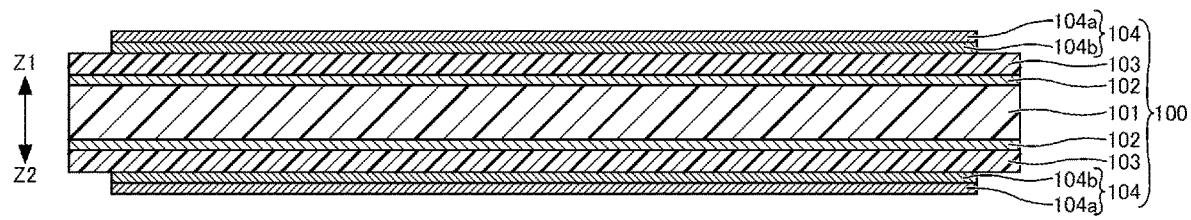
FIG. 15A, FIG. 15B, FIG. 15C, and FIG. 15D are cross sectional views (part 1) illustrating the method for manufacturing the wiring board according to the second embodiment.

First, similar to the first embodiment, the support body 100 is prepared (refer to FIG. 5A). Next, as illustrated in FIG. 15A, a portion of the upper carrier-attached copper film 104, and a portion of the lower carrier-attached copper film 104 are etched and removed, without forming the interconnect layer 11.

Figure 15B:
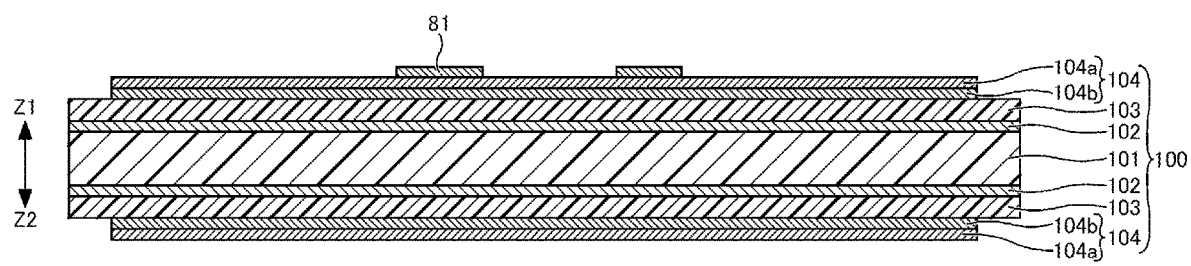

Next, as illustrated in FIG. 15B, the interconnect layer 81 is formed. The interconnect layer 81 can be formed using the semi-additive process, similar to the interconnect layer 14 of the first embodiment.

Figure 15C:
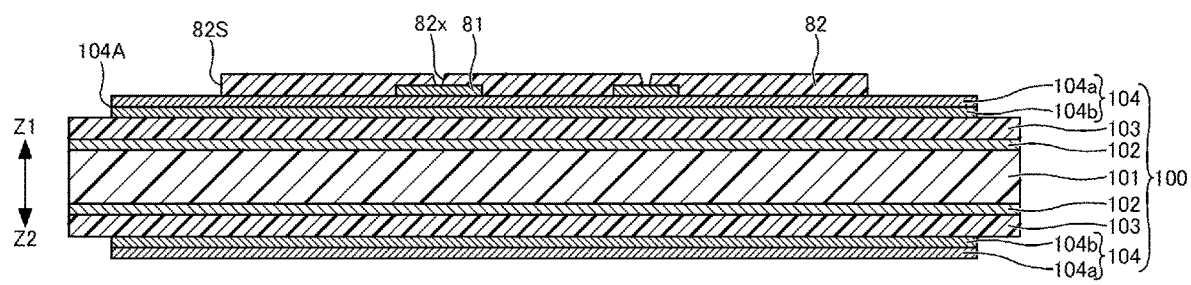

Next, as illustrated in FIG. 15C, a photosensitive insulating resin in liquid or paste form is coated on the upper surface 12a of the upper carrier-attached copper film 104, so as to cover the interconnect layer 81, and the insulating layer 82 in a semi-cured state is thereafter formed by heating to a temperature that does not cause complete curing. The material and thickness of the insulating layer 82 are as described above.

Next, the via hole 82x is formed by photolithography, for example, and the insulating layer 82 is thereafter heated to a temperature higher than or equal to the curing temperature to cure the insulating layer 82. When forming the via hole 82x, the insulating layer 82 is removed from above the outer peripheral portion of the upper surface of the upper carrier-attached copper film 104, and the side surface 82S of the insulating layer 82 is positioned on the inner side of the side surface of the upper carrier-attached copper film 104.

Figure 15D:
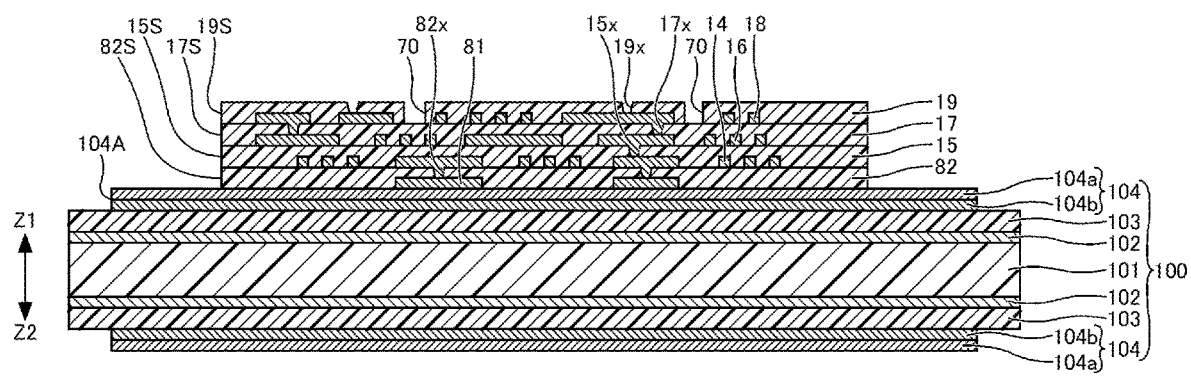

Next, as illustrated in FIG. 15D, similar to the first embodiment, the interconnect layer 14, the insulating layer 15, the interconnect layer 16, the insulating layer 17, the interconnect layer 18, and the insulating layer 19 are successively formed on the insulating layer 82. In addition, the via holes 15x, 17x, and 19x are formed, as appropriate.

Figure 16A:
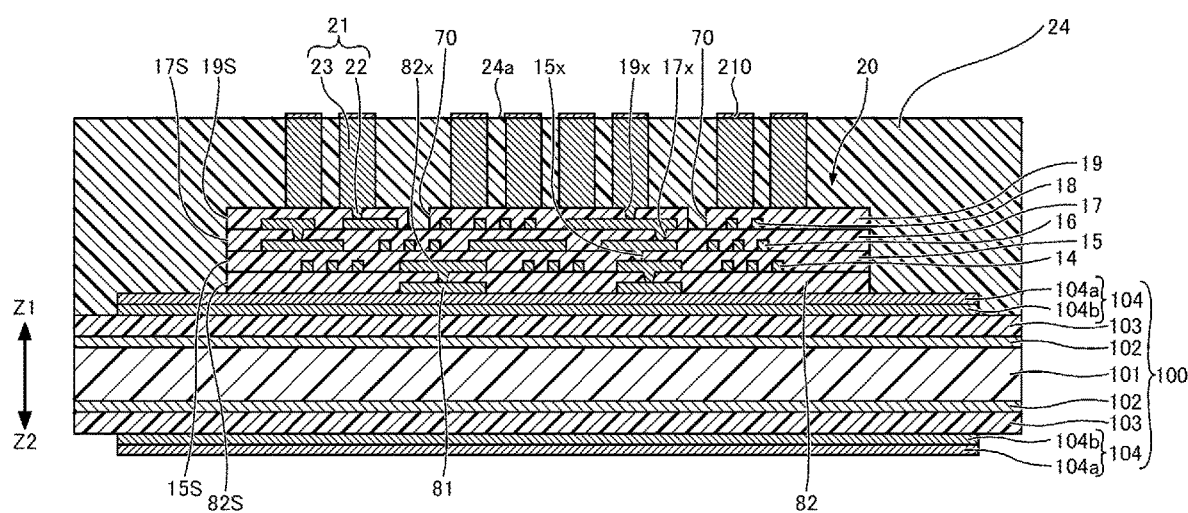
FIG. 16A and FIG. 16B are cross sectional views (part 2) illustrating the method for manufacturing the wiring board according to the second embodiment.

Next, as illustrated in FIG. 16A, the encapsulating resin layer 24 is formed on the support body 100, so as to cover the upper surface and the side surface of the pad 23 of the interconnect layer 21, and the upper surface and the side surface of the laminated structure 20 of the insulating layers 15, 17, 19, and 82. Similar to the first embodiment, the encapsulating resin layer 24 can be formed by the molding process using the mold resin, for example.

Figure 16B:
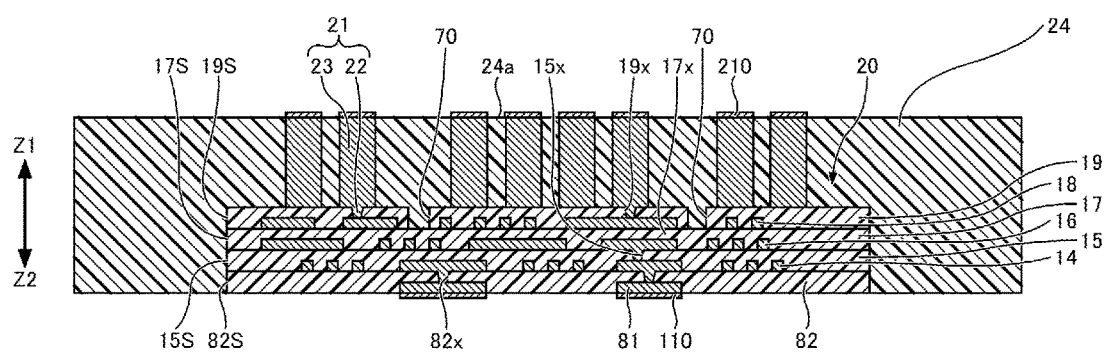

Next, as illustrated in FIG. 16B, similar to the first embodiment, the structure is cut using the dicing blade or the like, and the thin film 104a is removed. Further, the surface treated layer 210 and the surface treated layer 110 are formed, as required.

The wiring board 2 according to the second embodiment can be manufactured by the steps or processes described above.

In the wiring board 2, the encapsulating resin layer 24 covers not only the upper surface of the insulating layer 19, but also covers the side surface 15S of the insulating layer 15, the side surface 17S of the insulating layer 17, the side surface 19S of the insulating layer 19, and the side surface 82S of the insulating layer 82. Accordingly, the portion of the encapsulating resin layer 24 on the outer side of the side surfaces 15S, 17S, 19S, and 82S is thicker than the portion where the pad 23 is formed (portion above the upper surface of the insulating layer 19). Further, the first slit 71, the second slit 72, the third slit 73, the fourth slit 74, and the fifth slit 75 are filled with the encapsulating resin layer 24. For this reason, similar to the first embodiment, it is possible to reduce the warp.

Third Embodiment

Figure 17:
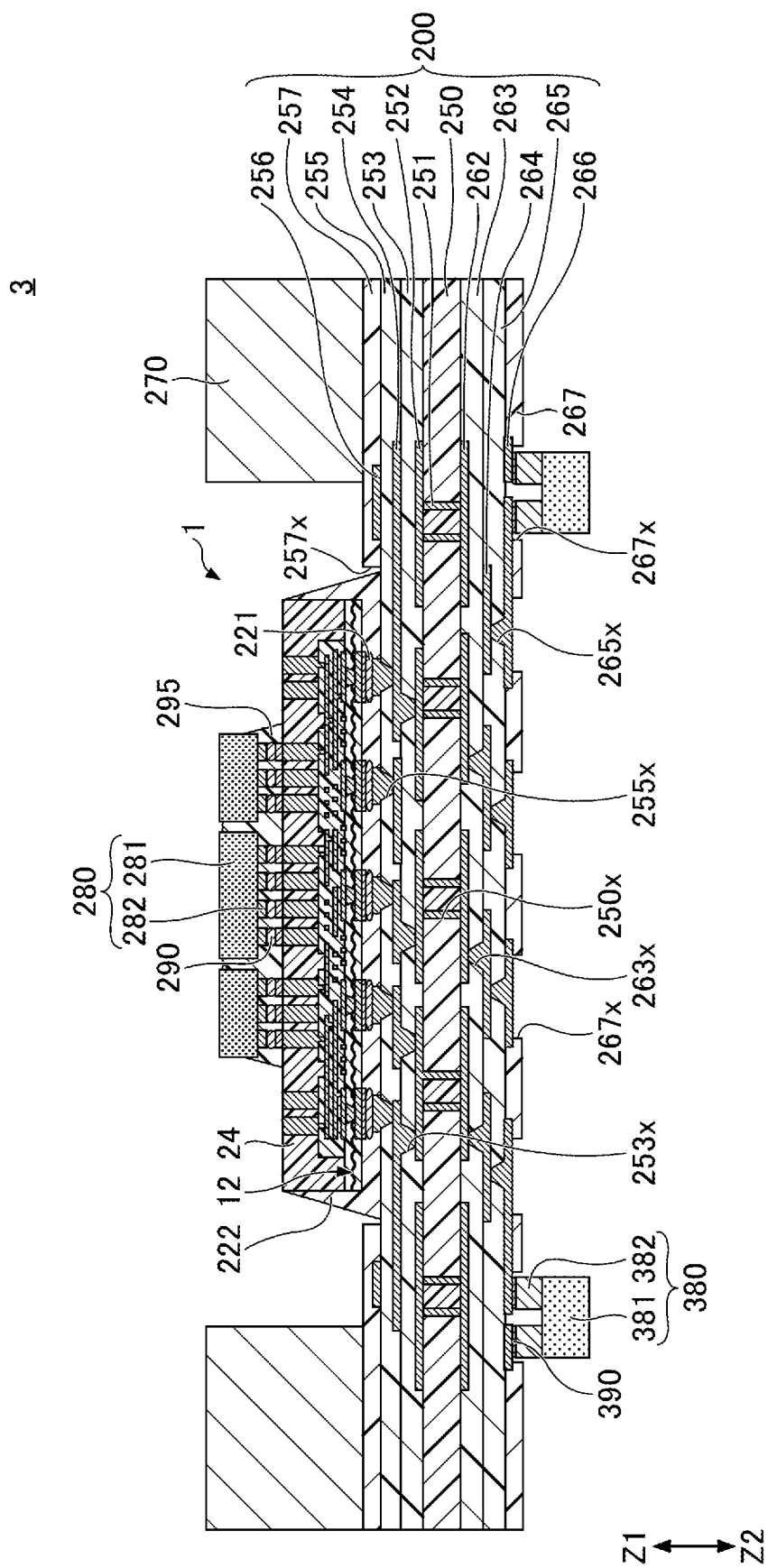
FIG. 17 is a cross sectional view illustrating a semiconductor device according to a third embodiment.

Next, a third embodiment will be described. The third embodiment relates to a semiconductor device including the wiring board 1 according to the first embodiment. FIG. 17 is a cross sectional view illustrating the semiconductor device according to the third embodiment.

As illustrated in FIG. 17, a semiconductor device 3 according to the third embodiment includes the wiring board 1 according to the first embodiment, and a base board 200.

The base board 200 is a multi-layer wiring board having interconnect layers and insulating layers laminated on both sides of a core layer 250, and can be made by a known build-up process. Each interconnect layer of the base board 200 has an interconnect density lower than the interconnect density (a line/space wider than the line/space) of each of the interconnect layers 14, 16, 18, and 21 of the wiring board 1. The line/space of each interconnect layer of the base board 200 may be approximately 20 μm/20 μm, for example.

In the base board 200, an interconnect layer 252, an insulating layer 253, an interconnect layer 254, an insulating layer 255, an interconnect layer 256, and a solder resist layer 257 are successively laminated on one surface (upper surface in FIG. 17) of the core layer 250. In addition, an interconnect layer 262, an insulating layer 263, an interconnect layer 264, an insulating layer 265, an interconnect layer 266, and a solder resist layer 267 are successively laminated on the other surface of the core layer 250.

The core layer 250 may be a so-called glass epoxy substrate or the like having a glass cloth impregnated with an insulating resin, such as an epoxy-based resin or the like, for example. A substrate or the like having a woven or non-woven fabric, such as glass fibers, carbon fibers, aramid fibers, or the like impregnated with an epoxy-based resin, a polyimide-based resin, or the like may be used for the core layer 250. A thickness of the core layer 250 may be in a range of approximately 60 μm to approximately 400 μm, for example. A through hole 250x, that penetrates the core layer 250 in a thickness direction thereof, is provided in the core layer 250. A planar shape of the through hole 250x may be a circular shape, for example.

The interconnect layer 252 is formed on one surface of the core layer 250. In addition, the interconnect layer 262 is formed on the other surface (lower surface in FIG. 17) of the core layer 250. The interconnect layer 252 and the interconnect layer 262 are electrically connected by a through interconnect 251 formed inside the through hole 250x. The interconnect layers 252 and 262 are patterned to predetermined planar shapes, respectively. A material used for the interconnect layers 252 and 262, and the through interconnect 251, may be copper (Cu) or the like, for example. A thickness of the interconnect layers 252 and 262 may be in a range of approximately 10 μm to approximately 30 μm, for example. The interconnect layer 252, the interconnect layer 262, and the through interconnect 251 may be integrally formed.

The insulating layer 253 is formed on one surface of the core layer 250, so as to cover the interconnect layer 252. A material used for the insulating layer 253 may be an insulating resin or the like having an epoxy-based resin or a polyimide-based resin as a main component thereof, for example. A thickness of the insulating layer 253 may be in a range of approximately 30 μm to approximately 40 μm, for example. The insulating layer 253 may include a filler, such as silica ($SiO_2$) or the like.

The interconnect layer 254 is formed on one side (Z1-side) of the insulating layer 253. The interconnect layer 254 includes a via interconnect filling a via hole 253x that penetrates the insulating layer 253 to expose an upper surface of interconnect layer 252, and an interconnect pattern formed on an upper surface of insulating layer 253. The interconnect pattern forming the interconnect layer 254 is electrically connected to the interconnect layer 252 through the via interconnect. The via hole 253x may be a cavity having an inverted truncated cone shape, and a diameter of an opening of the cavity at one end which opens to the insulating layer 255 is greater than a diameter of the opening at the other end at a bottom surface of the cavity formed by the upper surface of the interconnect layer 252. The material and the thickness of the interconnect pattern of the interconnect layer 254 may be similar to those of the interconnect layer 252, for example.

The insulating layer 255 is formed on the upper surface of the insulating layer 253, so as to cover the interconnect layer 254. The material and thickness of the insulating layer 255 may be similar to those of the insulating layer 253, for example. The insulating layer 255 may include a filler, such as silica ($SiO_2$) or the like.

The interconnect layer 256 is formed on one side (Z1-side) of the insulating layer 255. The interconnect layer 256 includes a via the interconnect filling a via hole 255x that penetrates the insulating layer 255 to expose an upper surface of interconnect layer 254, an interconnect pattern formed on an upper surface of insulating layer 255, and a pad formed on the inner side of an opening 257x in the solder resist layer 257. The interconnect pattern forming the interconnect layer 256 is electrically connected to the interconnect layer 254 through the via interconnect. The via hole 255x may be a cavity having an inverted truncated cone shape, and a diameter of an opening of the cavity at one end which opens to the wiring board 1 is greater than a diameter of the opening at the other end at a bottom surface of the cavity formed by the upper surface of the interconnect layer 254. The material and the thickness of the interconnect pattern of the interconnect layer 256 may be similar to those of the interconnect layer 252, for example.

The solder resist layer 257 is formed on the upper surface of insulating layer 255, so as to cover the interconnect layer 256. The solder resist layer 257 may be formed using a photosensitive resin or the like, such as epoxy-based resins, acrylic-based resins, or the like, for example. A thickness of the solder resist layer 257 may be in a range of approximately 15 μm to approximately 35 μm, for example.

A planar shape of the pad forming the interconnect layer 256 may be a circular shape, for example. The surface treated layer described above may be formed on the surface (only the upper surface, or the upper surface and the side surface) of the pad forming the interconnect layer 256, as required.

The insulating layer 263 is formed on the other surface of the core layer 250, so as to cover the interconnect layer 262. The material and thickness of the insulating layer 263 may be similar to those of the insulating layer 253, for example. The insulating layer 263 can include a filler, such as silica ($SiO_2$) or the like.

The interconnect layer 264 is formed on the other side (Z2-side) of the insulating layer 263. The interconnect layer 264 includes a via interconnect filling a via hole 263x that penetrates the insulating layer 263 and exposes a lower surface of interconnect layer 262, and an interconnect pattern formed on a lower surface of insulating layer 263. The interconnect pattern forming the interconnect layer 264 is electrically connected to the interconnect layer 262 through the via interconnect. The via hole 263x may be a cavity having an inverted truncated cone shape, and a diameter of an opening of the cavity at one end which opens to the insulating layer 265 is greater than a diameter of the opening at the other end at a bottom surface of the cavity formed by the lower surface of the interconnect layer 262. The material and thickness of the interconnect layer 264 may be similar to those of the interconnect layer 252, for example.

The insulating layer 265 is formed on the lower surface of the insulating layer 263, so as to cover the interconnect layer 264. The material and thickness of the insulating layer 265 may be similar to those of the insulating layer 253, for example. The insulating layer 265 may include a filler, such as silica ($SiO_2$) or the like.

The interconnect layer 266 is formed on the other side (Z2-side) of the insulating layer 265. The interconnect layer 266 includes a via interconnect filling a via hole 265x that penetrates the insulating layer 265 to expose a lower surface of interconnect layer 264, and an interconnect pattern formed on a lower surface of insulating layer 265. The interconnect pattern forming the interconnect layer 266 is electrically connected to interconnect layer 264 through the via interconnect. The via hole 265x may be a cavity having an inverted truncated cone shape, and a diameter of an opening of the cavity at one end which opens to the solder resist layer 267 is greater than a diameter of the opening at the other end at a bottom surface of the cavity formed by the lower surface of the interconnect layer 264. The material and thickness of the interconnect layer 266 may be similar to those of the interconnect layer 252, for example.

The solder resist layer 267 is formed on the lower surface of insulating layer 265, so as to cover the interconnect layer 266. The material and thickness of the solder resist layer 267 may be similar to those of the solder resist layer 257, for example. The solder resist layer 267 has an opening 267x, and a portion of a lower surface of the interconnect layer 266 is exposed inside the opening 267x. A planar shape of the opening 267x may be a circular shape, for example. The surface treated layer described above may be formed on the lower surface of the interconnect layer 266 that is exposed inside the opening 267x, as required.

The wiring board 1 is mounted on the base board 200. More particularly, the interconnect layer 11 that forms the external connection terminal of the wiring board 1, and the interconnect layer 256 that forms an external connection terminal of the base board 200, are bonded by a solder layer 221. In addition, a bonding layer (adhesive layer) 222 is filled between the lower surface of the wiring board 1 (lower surface of the insulating layer 12) and the upper surface of the base board 200 (upper surface of the insulating layer 255). The bonding layer 222 also covers a portion of the side surface of the wiring board 1. The wiring board 1 and the base board 200 are bonded together by the bonding layer 222.

A stiffener 270 is fixed to an outer peripheral portion of the upper surface of the base board 200 (upper surface of the solder resist layer 257). A planar shape of the stiffener 270 may be a picture-frame shape, for example. The stiffener 270 reinforce the overall strength of the semiconductor device 3. A material used for the stiffener 270 may be SUS 304 (stainless steel having Cr and Ni as main components thereof: 0.08C-18Cr-8Ni) or the like, for example. A metal plate made of copper, copper alloy, or the like, or a resin plate such as a glass epoxy substrate or the like, may be used for the stiffener 270. The stiffener 270 may be provided, as required.

The semiconductor device 3 further includes a semiconductor chip 280, a bump 290, an underfill resin 295, a chip capacitor 380, and a bump 390. A plurality of semiconductor chips 280 may be flip-chip bonded to the wiring board 1.

The semiconductor chip 280 includes a semiconductor integrated circuit (not illustrated) or the like formed on a thin semiconductor substrate 281 made of silicon or the like, for example. An electrode pad 282, electrically connected to the semiconductor integrated circuit (not illustrated), is formed on a circuit forming surface of the semiconductor substrate 281.

The electrode pad 282 of the semiconductor chips 280 is electrically connected to the interconnect layer 21 of the wiring board 1 through the bump 290. The underfill resin 295 is filled between the circuit forming surface of the semiconductor chip 280 and the upper surface of the wiring board 1, and covers the side surface of the semiconductor chip 280. The bump 290 may be a solder bump, for example. Examples of a material used for the solder bump include SnBi solder or the like, for example.

The plurality of semiconductor chips 280 may have the same size or different sizes. In addition, the plurality of semiconductor chips 280 may have the same function or different functions. Examples of the functions of the semiconductor chip 280 include memory (DRAM or the like) and logic (CPU or the like). Further, the wiring board 1 may be mounted with one or two semiconductor chips 280, or four or more semiconductor chips 280.

The chip capacitor 380 includes a main body 381, and an electrode pad 382, for example. The electrode pad 382 of the chip capacitor 380 is electrically connected to the interconnect layer 266 of the base board 200 through the bump 390. The material used for the bump 390 may be similar to that of the bump 290, for example.

The semiconductor device 3 according to the third embodiment includes the wiring board 1. For this reason, the warp of the wiring board 1 is reduced, thereby enabling the semiconductor device 3 to have an excellent reliability.

In each of the embodiments described above, one or a plurality of via holes may be provided in an insulating layer, and one a plurality of via interconnects may be provided according to the number of via holes provided in the insulating layer. Further, one or a plurality of interconnect patterns may be provided on the insulating layer. That is, one or a plurality of interconnect patterns may form an interconnect layer.

Accordingly to each of the embodiments described above, it is possible to reduce the warp.

Various aspects of the subject-matter described herein may be set out non-exhaustively in the following numbered clauses:

1. A method for manufacturing a wiring board, comprising:
   forming, on a support body, a first interconnect structure that includes a plurality of first interconnect layers, and a plurality of insulating layers having a photosensitive resin as a main component thereof, wherein an uppermost first interconnect layer of the plurality of interconnect layers includes a pad protruding from the uppermost first insulating layer, and the pad is configured to receive a semiconductor chip to be mounted thereon;
   forming an encapsulating resin layer having a non-photosensitive thermosetting resin as a main component thereof, so that the encapsulating resin layer exposes an upper surface of the pad, and covers at least a portion of a side surface of the pad, and at least a portion of side surfaces of the plurality of first insulating layers; and
   separating the support body from the first interconnect structure.

2. The method for manufacturing the wiring board according to clause 1, wherein the forming the encapsulating resin layer forms the encapsulating resin layer so as to cover an entirety of the side surfaces of the plurality of first insulating layers.

3. The method for manufacturing the wiring board according to clause 1, further comprising:
   forming a second interconnect structure that includes a second interconnect layer, and a second insulating layer having a non-photosensitive thermosetting resin as a main component thereof, wherein
   the forming the first interconnect structure laminates the first interconnect structure on the second interconnect structure, and
   the forming the encapsulating resin layer forms the encapsulating resin layer so as to cover an upper surface of the second interconnect structure.

4. The method for manufacturing the wiring board according to clause 3, wherein the forming the encapsulating resin layer forms the encapsulating resin layer to a thickness, from an upper surface of the uppermost first insulating layer to an upper surface of the encapsulating resin layer, that is greater than a thickness of the second insulating layer.

5. The method for manufacturing the wiring board according to clause 3, wherein
   a thermal expansion coefficient of the encapsulating resin layer is lower than a thermal expansion coefficient of the plurality of first insulating layers, and the thermal expansion coefficient of the encapsulating resin layer is approximately equal to a thermal expansion coefficient of the second insulating layer.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
    a first interconnect structure including a plurality of first interconnect layers, and a plurality of insulating layers having a photosensitive resin as a main component thereof; and
    an encapsulating resin layer having a non-photosensitive thermosetting resin as a main component thereof, laminated on an uppermost first insulating layer of the plurality of first insulating layers, wherein:
    an uppermost first interconnect layer of the plurality of first interconnect layers includes a pad protruding from the uppermost first insulating layer,
    the encapsulating resin layer exposes an upper surface of the pad, and covers at least a portion of a side surface of the pad, and at least a portion of side surfaces of the plurality of first insulating layers,
    a thickness of the pad from an upper surface of the first interconnect structure to the upper surface of the pad is greater than or equal to a thickness of the encapsulating resin layer from the upper surface of the first interconnect structure to an upper surface of the encapsulating resin layer,
    the encapsulating resin layer fills a slit extending from an upper surface of the uppermost first insulating layer and stops at an interface between a lower surface of the uppermost first insulating layer and an upper surface of a second uppermost first insulating layer adjacent to the uppermost first insulating layer, and
    the pad is configured to receive a semiconductor chip to be mounted thereon.

2. The wiring board as claimed in claim 1, wherein the encapsulating resin layer covers an entirety of the side surfaces of the plurality of first insulating layers.

3. The wiring board as claimed in claim 1, wherein the slit surrounds an area where the semiconductor chip is to be mounted.

4. The wiring board as claimed in claim 1, further comprising:
    a second interconnect structure including a second interconnect layer, and a second insulating layer having a non-photosensitive thermosetting resin as a main component thereof, wherein
    the first interconnect structure is laminated on the second interconnect structure, and
    the encapsulating resin layer covers an upper surface of the second interconnect structure.

5. The wiring board as claimed in claim 4, wherein the thickness of the encapsulating resin layer is greater than a thickness of the second insulating layer from a lower surface of the second insulating layer to an upper surface of the second insulating layer.

6. The wiring board as claimed in claim 4, wherein
    the second interconnect layer of the second interconnect structure is exposed at a lower surface of the second insulating layer,
    the second interconnect structure includes a via interconnect penetrating the second insulating layer and electrically connecting to the second interconnect layer, and
    a lowermost first interconnect layer of the plurality of first interconnect layers of the first interconnect structure is directly bonded to a top end surface of the via interconnect through a seed layer.

7. The wiring board as claimed in claim 4, wherein
    a thermal expansion coefficient of the encapsulating resin layer is lower than a thermal expansion coefficient of each first insulating layer of the plurality of first insulating layers, and
    the thermal expansion coefficient of the encapsulating resin layer is equal to a thermal expansion coefficient of the second insulating layer.

8. The wiring board as claimed in claim 1, further comprising:
    a second interconnect structure provided on a lower surface of the first interconnect structure, wherein:
    the second interconnect structure includes low-density interconnect layers having an interconnect density lower than an interconnect density of each of high-density interconnect layers of the first interconnect structure,
    the encapsulating resin layer is provided on an upper surface of the second interconnect structure so as to cover the upper surface and a side surface of the first interconnect structure, and
    the encapsulating resin layer surrounds the first interconnect structure in a plan view viewed from above in a direction perpendicular to the upper surface of the first interconnect structure.

9. A semiconductor device comprising:
    a base board;
    the wiring board according to claim 1, mounted on the base board; and
    the semiconductor chip mounted on the wiring board.

* * * * *